(12) United States Patent
Takafuji

(10) Patent No.: US 8,587,743 B2
(45) Date of Patent: Nov. 19, 2013

(54) INKJET IMAGE-DRAWING DEVICE

(75) Inventor: Yoshifumi Takafuji, Kodaira (JP)

(73) Assignee: Konica Minolta Holdings, Inc. (JP)

( * ) Notice: Subject to any disclaimer, the term of this patent is extended or adjusted under 35 U.S.C. 154(b) by 174 days.

(21) Appl. No.: 13/119,020

(22) PCT Filed: Sep. 2, 2009

(86) PCT No.: PCT/JP2009/065311
§ 371 (c)(1),
(2), (4) Date: Mar. 15, 2011

(87) PCT Pub. No.: WO2010/032615
PCT Pub. Date: Mar. 25, 2010

(65) Prior Publication Data
US 2011/0169893 A1     Jul. 14, 2011

(30) Foreign Application Priority Data

Sep. 18, 2008  (JP) .................................. 2008-239032

(51) Int. Cl.
*B41J 2/14*  (2006.01)
*B41J 2/16*  (2006.01)

(52) U.S. Cl.
USPC .......................................................... 349/49

(58) Field of Classification Search
USPC .......................................................... 347/49
See application file for complete search history.

(56) References Cited

U.S. PATENT DOCUMENTS

| | | | |
|---|---|---|---|
| 6,752,486 B2 * | 6/2004 | Goto ................................ | 347/40 |
| 2009/0128612 A1 * | 5/2009 | Sano ............................. | 347/106 |
| 2010/0207980 A1 * | 8/2010 | Kim et al. ....................... | 347/12 |

FOREIGN PATENT DOCUMENTS

| | | |
|---|---|---|
| JP | 9-283403 A | 10/1997 |
| JP | 2000-187115 A | 7/2000 |
| JP | 2002-361852 A | 12/2002 |
| JP | 2004-243187 A | 9/2004 |
| JP | 2006-258845 A | 9/2006 |
| JP | 2007-90686 A | 4/2007 |
| JP | 2008-34743 A | 2/2008 |
| JP | 2008-139741 A | 6/2008 |
| WO | 2008/013188 A1 | 1/2008 |
| WO | 2008/069203 A1 | 6/2008 |

OTHER PUBLICATIONS

International Search Report for International Application No. PCT/JP2009/065311 mailed Dec. 1, 2009 with English translation.

* cited by examiner

*Primary Examiner* — Matthew Luu
*Assistant Examiner* — Renee I Wilson
(74) *Attorney, Agent, or Firm* — Cantor Colburn LLP

(57) ABSTRACT

An inkjet image-drawing device having: a head module having inkjet heads for forming a pattern on a substrate; a head module moving means; a substrate support stage; a substrate support stage moving means including first and second linear moving means, and a rotation moving means; an image pickup means which picks up an mage of the substrate; and an alignment adjusting means which picks up images of markers arranged on the substrate with the image pickup means, and moves the substrate support stage based on a result of the picking up images to adjust the alignment, wherein the image pickup means has, on the main body the device, a camera fixedly disposed outside of a moving range of the head module in the vector direction of the first linear moving means, and a camera fixedly disposed outside of the moving range, in the vector direction of the second linear moving means.

5 Claims, 14 Drawing Sheets

INKJET IMAGE-DRAWING DEVICE

This is a U.S. national stage application of International Application No. PCT/JP2009/065311, filed on 2 Sep. 2009. Priority under 35 U.S.C. §119(a) and 35 U.S.C. §365(b) is claimed from Japanese Application No. JP2008-239032, filed 18 Sep. 2008, the disclosure of the which is also incorporated herein by reference.

The present invention relates to an inkjet image-drawing device, and in particular, to an inkjet image-drawing device wherein it is possible to conduct image recognition on a substrate with cameras fixedly arranged on a main body of a device, while securing a place to which a head unit comes, under the limited moving distance of the substrate, and it is possible to confirm both alignment of the substrate and a position of impact.

BACKGROUND TECHNOLOGY

The inkjet image-drawing device that conducts image-drawing by causing a liquid-drop to impact on a substrate (work) by using an inkjet head is utilized widely for an industrial use such as drawing of a wiring pattern on a semiconductor substrate and a pixel pattern of a color filter in a liquid crystal display device, for example. In the use of this kind, image drawing is conducted generally by using a head unit wherein a long line head is structured by arranging many inkjet heads in a zigzag fashion, for enhancing productivity.

By the way, in the inkjet image-drawing device of this kind, image drawing which is extremely precise and highly accurate is requested. For example, in the image-drawing of wiring pattern of semiconductor substrate, it is necessary to cause a liquid-drop to impact at an accurate position in a micron order without causing a short circuit with adjoining wiring, and it is necessary to cause a liquid-drop in a prescribed color to impact accurately in a prescribed matrix in accuracy of a micron order, in the case of image-drawing of image pattern of a color filter. Therefore, it is necessary for the positional relation between an inkjet head and a substrate and for the position of impact of a liquid-drop to be controlled strictly.

Therefore, there has been known a technology to conduct image recognition for a substrate by cameras, and thereby to conduct positional correction for the substrate and an inkjet head, based on the aforesaid image recognition.

Namely, Patent Document 1 discloses that an alignment optical system for measuring slippage of a substrate for a standard position and a position evaluating optical system for image recognition are provided on the same stage, and these optical systems are used to conduct positional adjustment for the substrate positioned to be lower than the aforesaid optical systems.

Patent Document 2 discloses that an image processing camera is arranged on a frame provided on a stone planometer, and a substrate positioned to be lower than the camera is picked up to correct the position of the substrate. In this device, highly accurate parallel straight lines can be drawn for the substrate, by causing a moving section to be made of stone or of ceramic.

Patent Document 3 discloses that a camera carriage is provided on X-axis direction moving mechanism having a main carriage that supports a head unit, and this camera carriage supports an alignment camera and an image-drawing confirmation camera to conduct position correction of the substrate by picking up the substrate position to be at a lower part.

Patent Document 4 discloses that an alignment camera is provided on a device frame, and a substrate positioned to be lower than the alignment camera is corrected in terms of its position by detecting XY axes coordinates of the substrate. Further, it is disclosed that a camera for detecting a position of impact is provided on a Y axis moving mechanism that is the same as a head.

Patent Document 5 discloses a head unit wherein a line head is structured by arranging many inkjet heads.

PRIOR ART DOCUMENT

Patent Document
Patent Document 1: Unexamined Japanese Patent Application Publication No. 2000-187115
Patent Document 2: Unexamined Japanese Patent Application Publication No. 2002-361852
Patent Document 3: Unexamined Japanese Patent Application Publication No. 2004-243187
Patent Document 4: Unexamined Japanese Patent Application Publication No. 2006-258845
Patent Document 5: Unexamined Japanese Patent Application Publication No. 2007-90686

SUMMARY OF THE INVENTION

Problems to be Solved by the Invention

For the purpose of controlling strictly the positional relation between an inkjet head and a substrate and a position of impact of a liquid-drop, it is necessary to provide a camera to be positioned above the substrate so that image recognition can be carried out for an alignment marker and a position of impact of a liquid-drop. The reason for the foregoing is that even one camera can conduct image recognition for a wide range of the substrate surface.

In Patent Documents 1-3, there are arranged so that image recognition for a wide range of the substrate surface may be carried out by cameras, by providing a camera on a stage that is the same as a head unit, and by arranging so that the camera can be moved together with the head unit to the prescribed position that is above the substrate surface.

However, for the image recognition on the substrate surface, a camera is always influenced by vibration caused by movement, including a movement of the camera and a movement of the camera together with a head unit in the case of ordinary image-drawing operations, and in the worst case, the camera is shaken in its state of installation, and a photographing point is shifted for each measurement, resulting in a problem that highly accurate image recognition is difficult. Though it is possible to consider moving the exclusive stage for camera to the substrate in the case of image recognition by providing a camera on an exclusive stage that is separate from a head unit, a problem of an accuracy decline caused by vibration following a movement still remains. There is further a problem of a cost increase of a device because a stage is an extremely expensive apparatus.

On the other hand, in Patent Document 4, an alignment camera is installed on a frame of a device, and a stage that carries a substrate is moved to the lower part of the camera, which makes it to consider that the problem caused by a movement of a camera mentioned above does not come into existence.

However, when conducting image recognition, a stage carrying the substrate needs to be moved to the lower part of the camera to be longer by a distance, thus, the moving length for the stage needs to be made longer by a length equivalent to the aforesaid distance, resulting in a problem that causes a large-sized device and a cost increase. On the contrary, when trying to form a work distance of a stage to be short, there is a fear that a camera and a head unit interfere each other, resulting in another problem that a movement of the head unit is troubled.

Further, for the purpose of controlling a position of impact of a liquid-drop strictly, it is desired that a position correction is conducted by confirming actual impact on the substrate. In addition, in the case of a line head, it is necessary that positions of impact can be confirmed for the total length of the head.

Therefore, an objective of the present invention is to provide an inkjet image-drawing device wherein image recognition on the substrate can be carried out by a plurality of cameras which are fixedly disposed on a main body of a device to be fixed in terms of a position, while securing a place to which the head unit moves, in a limited moving distance of the substrate, and coordinates on the substrate can be detected.

Other problems of the present invention are cleared by the following description.

Means to Solve the Problems

Problems mentioned above are solved by the following inventions.

1. An inkjet image-drawing device equipped with a head module composed of one or a plurality of inkjet heads for forming a pattern by conducting ink ejection processing for a substrate, a head module moving means that moves the aforesaid head module in at least one of the main scanning direction and the sub-scanning direction, a substrate support stage that places the substrate to be lower than the aforesaid head module to support, a substrate support stage moving means that has a first linear moving means that moves linearly the aforesaid substrate support stage in the first standard vector direction, a second linear moving means that moves the aforesaid substrate support stage in the second standard vector direction that is dependent from the first standard vector direction and a rotation moving means that rotation-moves the aforesaid substrate support stage with an axis of a vector direction that is in parallel with the direction of a normal of the aforesaid first and second standard vector, and with an image pick-up means that picks up the surface of the aforesaid substrate placed on the substrate support stage, wherein there is provided an alignment adjusting means in which plural alignment markers on the aforesaid substrate are picked up by the image pickup means, and alignment on the substrate is adjusted by moving the substrate support stage with the substrate support stage moving means based on the result of its image pickup, and the aforesaid image pickup means has at least a single camera fixedly disposed on a main body of a device on the outside of the movable range of the head module by the aforesaid head module moving means in the vector direction of the first linear moving means, and has at least a single camera fixedly disposed on a main body of a device on the outside of the movable range of the head module by the aforesaid head module moving means in the vector direction of the second linear moving means.

2. An inkjet image-drawing device equipped with a head module composed of one or a plurality of inkjet heads for forming a pattern by conducting ink ejection processing for a substrate, a head module moving means that moves the aforesaid head module in at least one of the main scanning direction and the sub-scanning direction, a substrate support stage that places the substrate to be lower than the aforesaid head module to support, a substrate support stage moving means that has a first linear moving means that moves linearly the aforesaid substrate support stage in the first standard vector direction, a second linear moving means that moves the aforesaid substrate support stage in the second standard vector direction that is dependent from the first standard vector direction and a rotation moving means that rotation-moves the aforesaid substrate support stage with an axis of a vector direction that is in parallel with the direction of a normal of the aforesaid first and second standard vector, and with an image pick-up means that picks up the surface of the aforesaid substrate placed on the substrate support stage, wherein there is provided an impact position confirmation means in which the aforesaid substrate is picked up by the image pickup means, and an impact position of an ink liquid-drop that is dripped on the substrate from the head module based on the result of its image pickup is confirmed, and the aforesaid image pickup means has at least a single camera fixedly disposed on a main body of a device on the outside of the movable range of the head module by the aforesaid head module moving means in the vector direction of the first linear moving means, and has at least a single camera fixedly disposed on a main body of a device on the outside of the movable range of the head module by the aforesaid head module moving means in the vector direction of the second linear moving means.

3. An inkjet image-drawing device equipped with a head module composed of one or a plurality of inkjet heads for forming a pattern by conducting ink ejection processing for a substrate, a head module moving means that moves the aforesaid head module in at least one of the main scanning direction and the sub-scanning direction, a substrate support stage that places the substrate to be lower than the aforesaid head module to support, a substrate support stage moving means that has a first linear moving means that moves linearly the aforesaid substrate support stage in the first standard vector direction, a second linear moving means that moves the aforesaid substrate support stage in the second standard vector direction that is dependent from the first standard vector direction and a rotation moving means that rotation-moves the aforesaid substrate support stage with an axis of a vector direction that is in parallel with the direction of a normal of the aforesaid first and second standard vector, and with an image pick-up means that picks up the surface of the aforesaid substrate placed on the substrate support stage wherein there are provided an alignment adjusting means in which a plurality of alignment markers on the substrate are picked up by the aforesaid image pickup means, and an alignment on the substrate is adjusted by moving the substrate support stage with the substrate support stage moving means based on the results of its image pickup and an impact position confirmation means in which the substrate is picked up by the aforesaid image pickup means, and an impact position of ink liquid-drop dripped on the substrate from the head module based on the result of the image pickup, and the aforesaid image pickup means has at least a single camera fixedly disposed on a main body of a device on the outside of the movable range of the head module by the aforesaid head module moving means in the vector direction of the first linear moving means, and has at least a single camera fixedly disposed on a main body of a device on the outside of the movable range of the head module by the aforesaid head module moving means in the vector direction of the second linear moving means.

4. An inkjet image-drawing device described in the aforesaid Item 3 characterized in that at least one camera fixedly disposed on a main body that is outside of a movable range of the aforesaid head module by the head module moving means, in the vector direction of the first linear moving means is a camera for confirming a position of impact that confirms a position of impact of an ink drop dripped on the substrate, and characterized in that at least one camera fixedly disposed on a main body that is outside of a movable range of the aforesaid head module by the head module moving means, in the vector direction of the second linear moving means is a camera for alignment that adjusts alignment of the substrate.

5. An inkjet image-drawing device described in the aforesaid Item 4 wherein a range of photographing of the camera for the aforesaid alignment can be established to satisfy Cy>2I·Lx/M (wherein M≧I and Cy>Ly>Lx hold constantly) when Cy represents a length of a range of photographing in the main scanning direction, Lx represents a length of the substrate in the sub-scanning direction, Ly represents a length of the substrate in the main scanning direction, I represents a guaranteed accuracy for measurement of the aforesaid alignment markers and M represents tolerance accuracy for targeted position shifting.

6. An inkjet image-drawing device described in the aforesaid Item 4 or 5 wherein a range of photographing of the camera for confirming the position of impact can be established to satisfy Cx>H when Cx represents a length of a range of photographing in the sub-scanning direction, Lx represents a length of the substrate in the sub-scanning direction, and H represents a width between two points of both ends in the sub-scanning direction of the aforesaid head module.

7. An inkjet image-drawing device described in either one of the aforesaid Items 1-6 characterized in that the substrate support stage has plural reference markers for measuring a camera standard position, and each camera is arranged to be capable of photographing commonly with at least one among the aforesaid reference markers in the image pickup means.

8. An inkjet image-drawing device described in the aforesaid Item 7 characterized to have a calculation means that associates coordinates between respective cameras of the aforesaid image pickup means, based on positional coordinates of the result of photographing of the aforesaid reference markers by the aforesaid image pickup means.

9. An inkjet image-drawing device described in the aforesaid Item 8 characterized in that the calculation means calculates, images picked up obtained by the aforesaid imaging means, and it makes any one set of camera among respective cameras to be a standard camera to correct coordinates of another camera to the coordinates system of the standard camera.

Effects of the Invention

The present invention makes it possible to provide an inkjet image-drawing device capable of detecting coordinates on the substrate that can conduct image recognition on the substrate by plural cameras which are fixedly disposed on a main body of the device to be immovable, while, securing a place to which the head unit comes under the limited moving distance of the substrate.

Figure 9A:
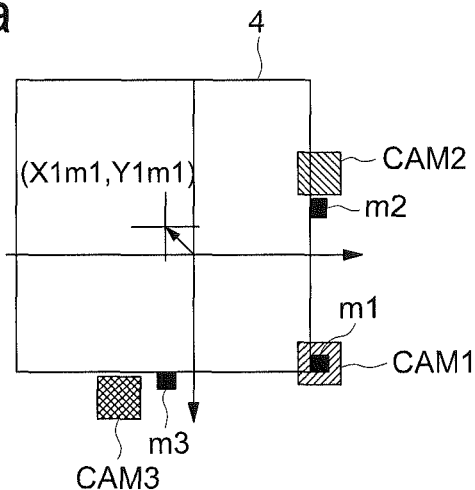
Figure 9B:
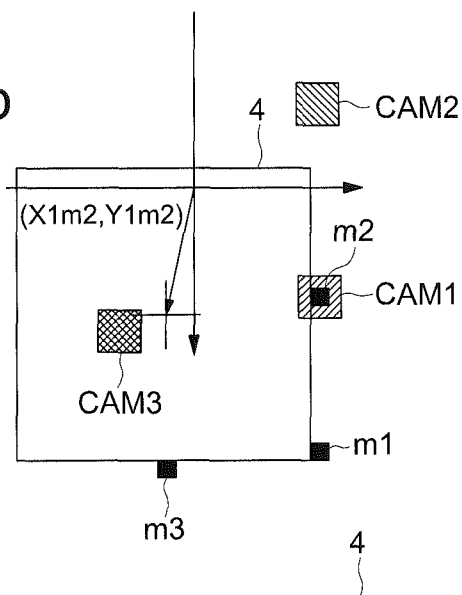
Figure 9C:
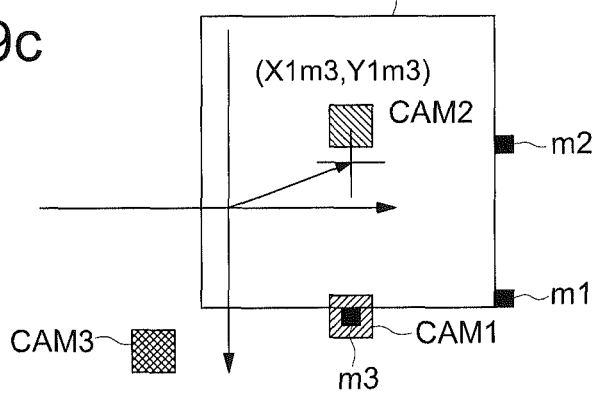

Each of FIGS. 9a-9c is a diagram illustrating how the positional coordinates of reference markers are obtained by the first camera.

Figure 10A:
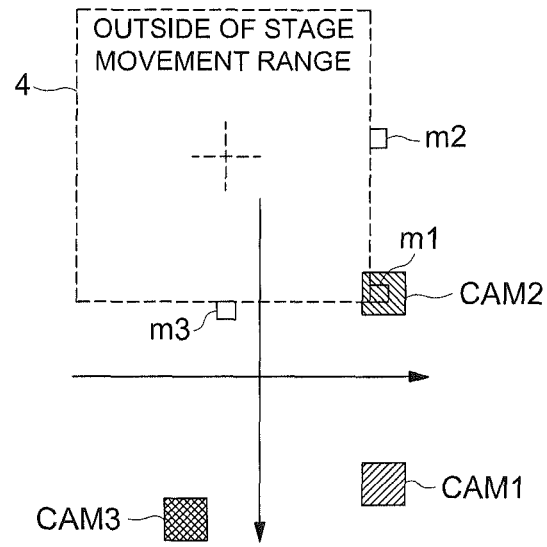
Figure 10B:
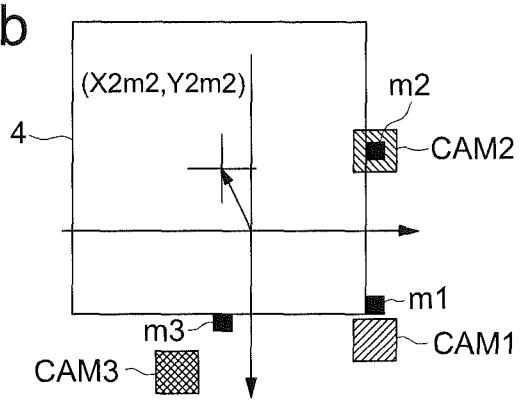
Figure 10C:
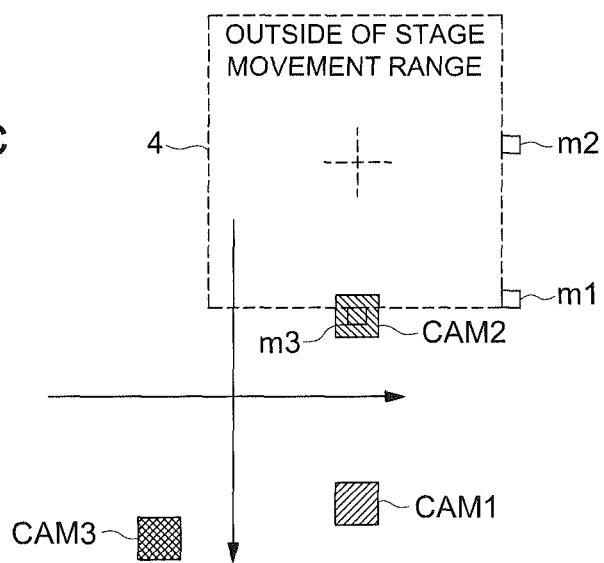

Each of FIGS. 10a-10c is a diagram illustrating how positional coordinates of the reference markers are obtained by the second camera.

Figure 11A:
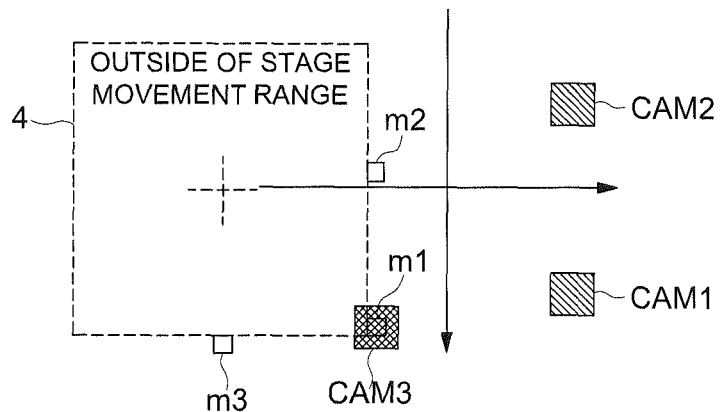
Figure 11B:
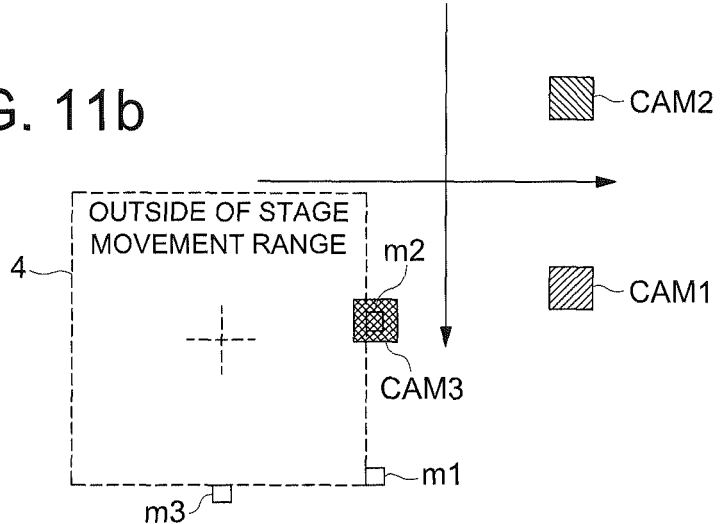
Figure 11C:
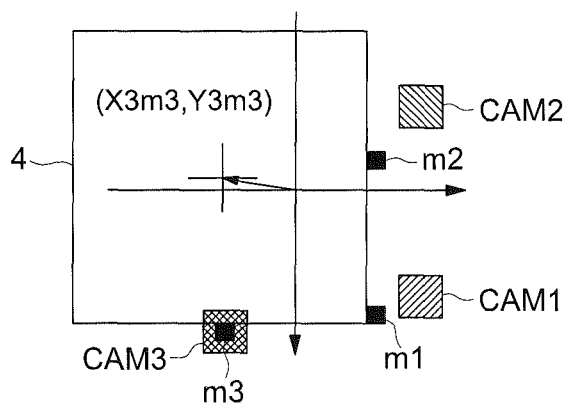

Each of FIGS. 11a-11c is a diagram illustrating how positional coordinates of the reference markers are obtained by the third camera.

Figure 12:
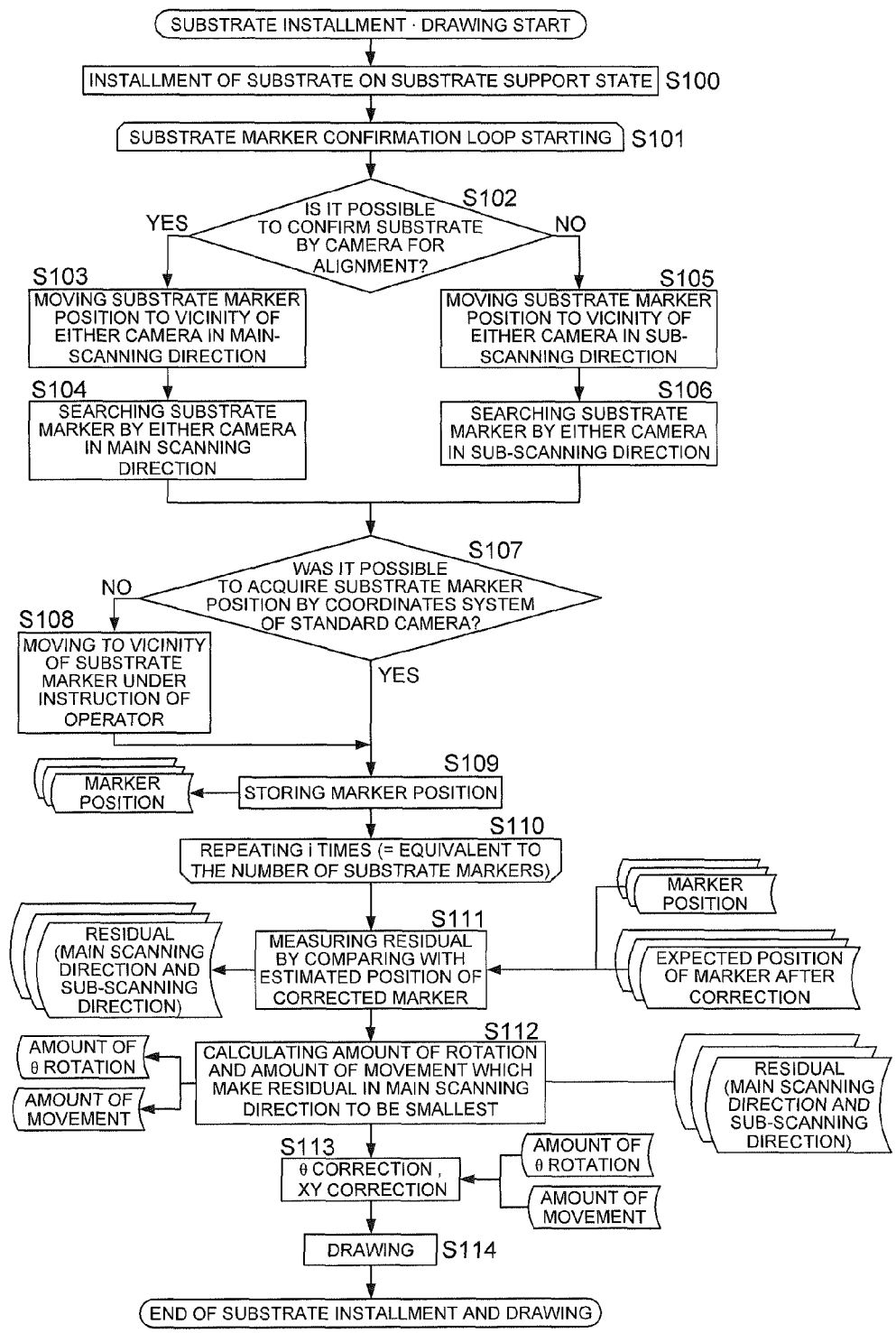

FIG. 12 is a flow chart showing a processing flow in the case of installing the substrate on the substrate support stage.

Figure 13:
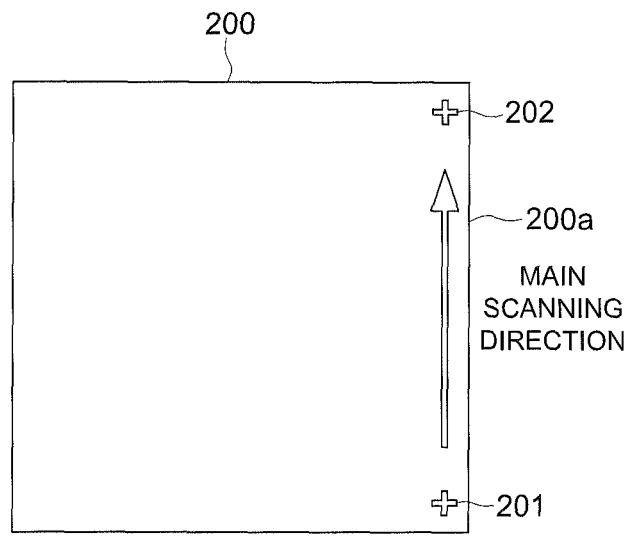

FIG. 13 is a plain view of the substrate.

Figure 14:
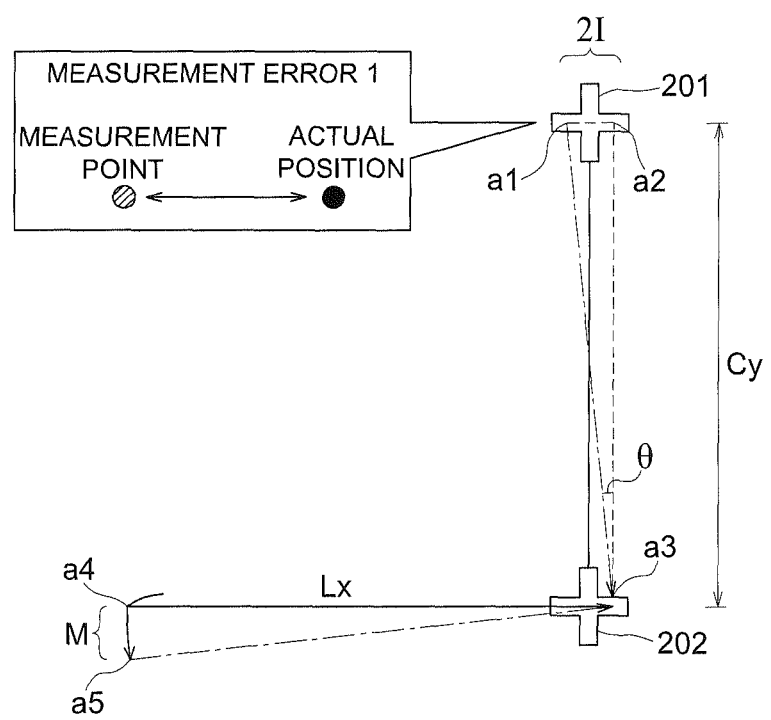

FIG. 14 is a diagram illustrating an error of measurement in the case of alignment adjustment.

Figure 15:
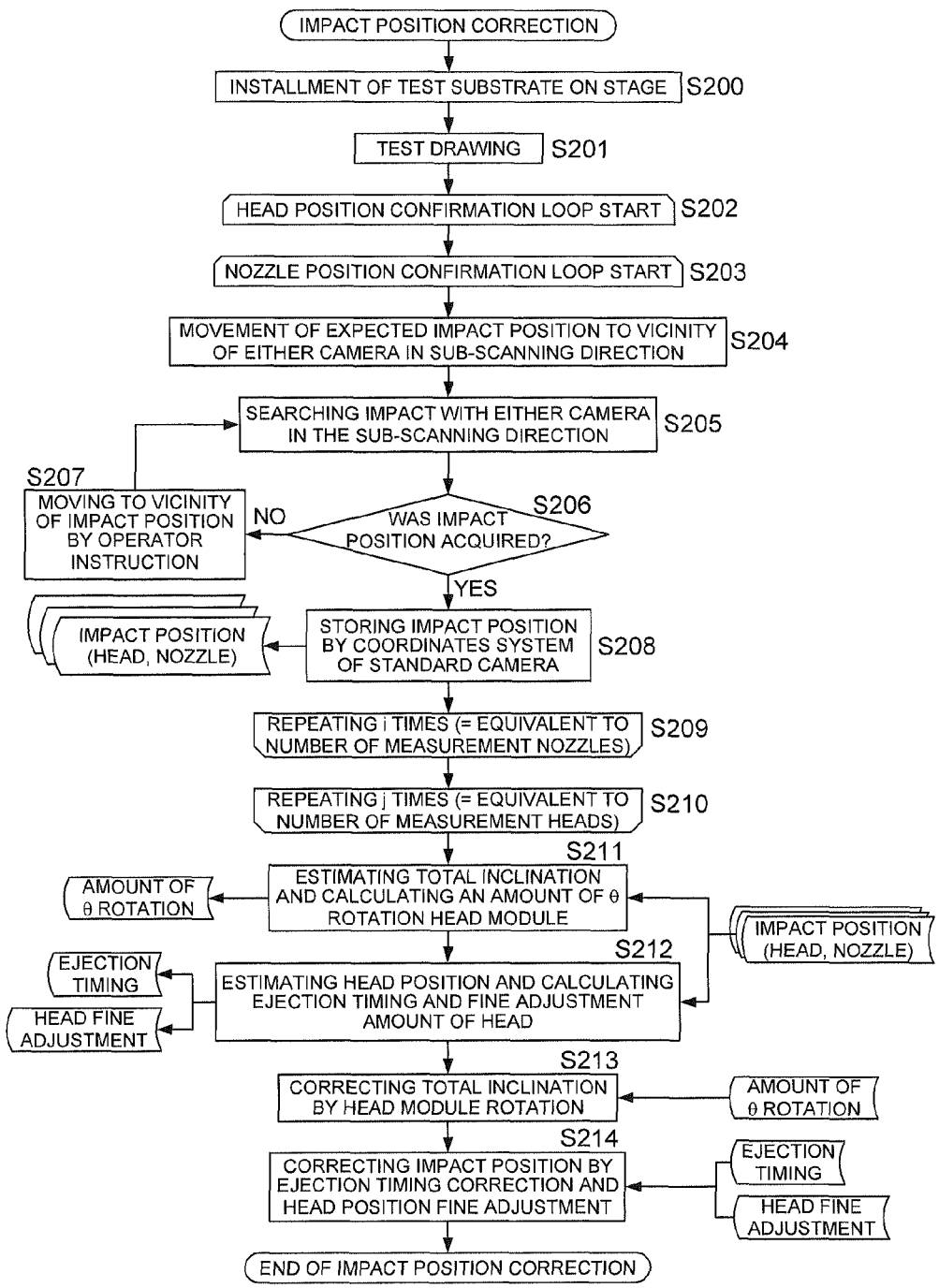

FIG. 15 is a flow chart showing a processing flow in the case of correcting a position of impact for ink.

DETAILED DESCRIPTION OF THE PREFERRED EMBODIMENTS

Embodiments for practicing the present invention will be explained in detail as follows, referring to the drawings.

Figure 1:
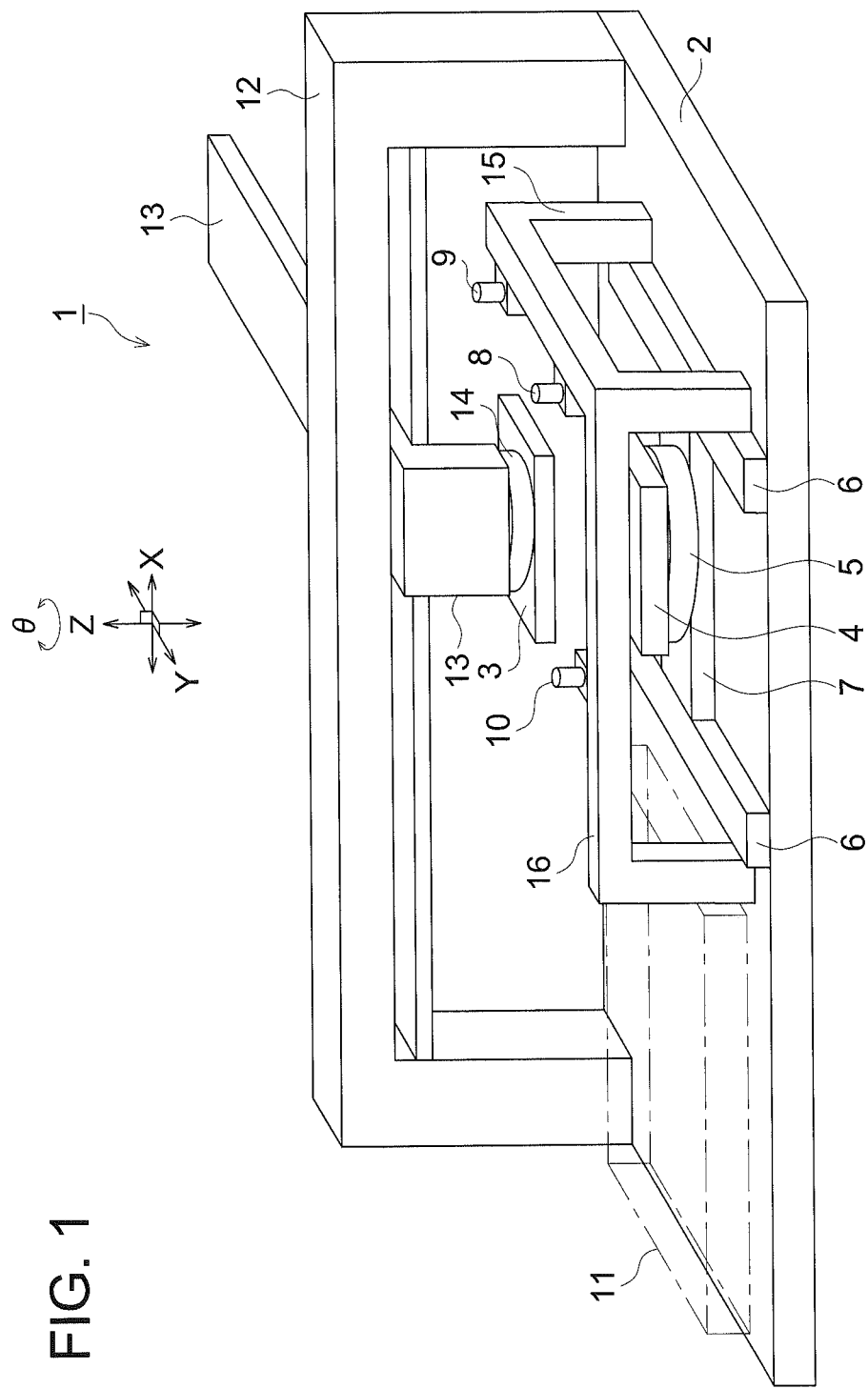
FIG. 1 is a perspective view showing a framework of an inkjet image-drawing device relating to the present invention.
Figure 2:
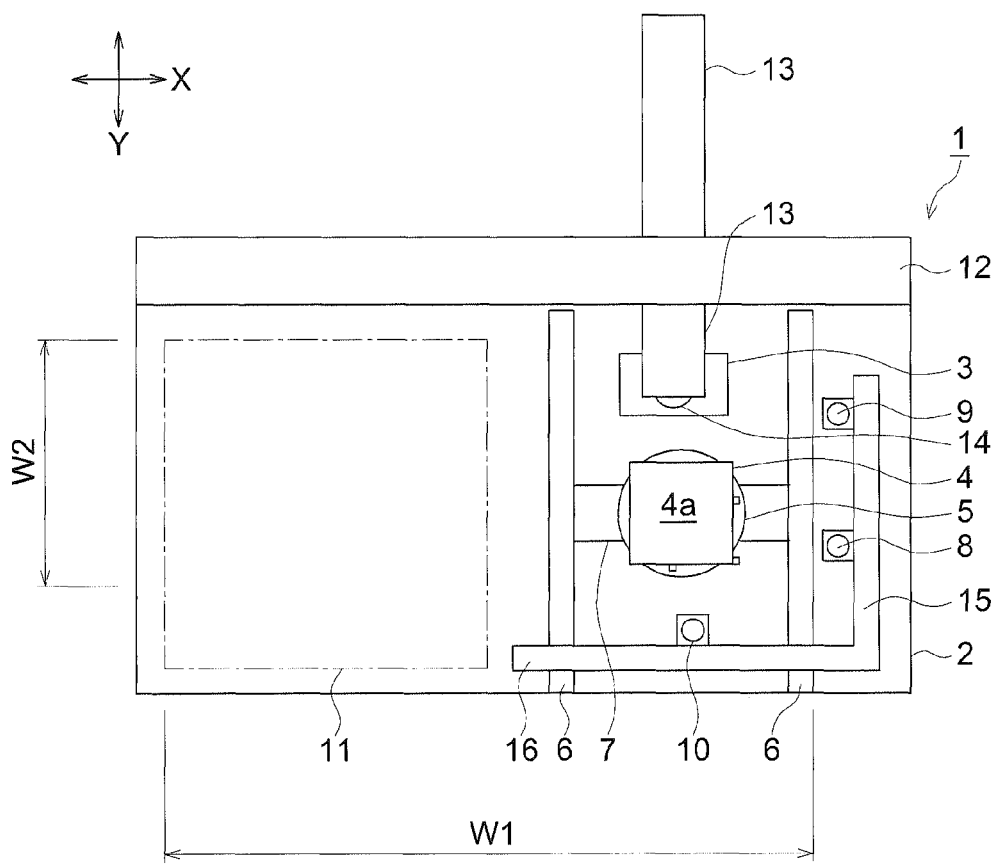
FIG. 2 is a plain view showing a framework of an inkjet image-drawing device relating to the present invention.

FIG. 1 is a perspective view showing a skeleton framework of an inkjet image-drawing device relating to the present invention, and FIG. 2 is its plain view.

Inkjet image-drawing device 1 has on its device base stand 2, head module 3 for conducting inkjet image-drawing, substrate support stage 4 for supporting substrate by placing it on the upper surface, θ rotation mechanism 5 for rotation-moving substrate support stage 4 in the θ direction, Y moving mechanism 6 for linear-moving the substrate support stage 4 and the θ rotation mechanism 5 in Y direction (That is sometimes called the main scanning direction.) X moving mechanism 7 for linear-moving the substrate support stage 4 and θ rotation mechanism 5 in the X direction (That is sometimes called the sub-scanning direction), and the first camera 8, the second camera 9 and the third camera 10. Incidentally, the X direction and the Y direction are the directions which meet at right angles on a horizontal plane each other, and in this case, the X direction is the second standard vector direction mentioned in the present invention, and the Y direction is the first standard vector direction mentioned in the present invention.

Further, the substrate support stage 4 is arranged to be capable of conducting rotation moving in the θ direction on the axis that is in parallel with Z direction which is a direction of a normal that crosses with X and Y directions at right angles, by the θ rotation mechanism 5, and this vector direction is a vector direction that is in parallel with the direction of a normal of each of the first and the second standard vectors.

In the drawing, the numeral 11 represents a maintenance area for head module 3, and on this maintenance area, there are provided various types of maintenance devices for guaranteeing injection accuracy of a head module, such as those for capping operations for preventing drying on a nozzle surface of head module 3, wiping operations for wiping ink and blurs sticking to a nozzle surface, sucking operations to suck ink from a nozzle forcibly, and cleaning operations to clean a nozzle surface with a washing solution. Explanations of details of these maintenance devices are omitted here, because widely known maintenance devices can be used.

Head module 3 is installed on gantry 12 that is mounted on device base stand 2 to be in parallel with sub-scanning direction in the vicinity on the end portion, through slider 13 and θ rotation mechanism 14, and the head module 3 is arranged to be capable of moving on a reciprocation basis in the X direction, when the slider 13 conducts sliding movement along the gantry 12, and to be capable of moving on a reciprocation basis in the Y direction when the slider 13 conducts sliding movement in the Y direction, and the head module 3 is arranged to be capable of moving in rotation in the θ direction with the direction parallel with Z direction that is a direction of a normal crossing with X and Y directions at right angles as an axis, by the θ rotation mechanism 14. Incidentally, this Z direction is a vector direction which is in parallel with a direction of a normal for the first and the second standard vectors mentioned in the present invention.

In FIG. 2, W1 represents a movable range that is in parallel with X direction of module 3, and W2 represents a movable range that is in parallel with Y direction of head module 2.

Figure 3:
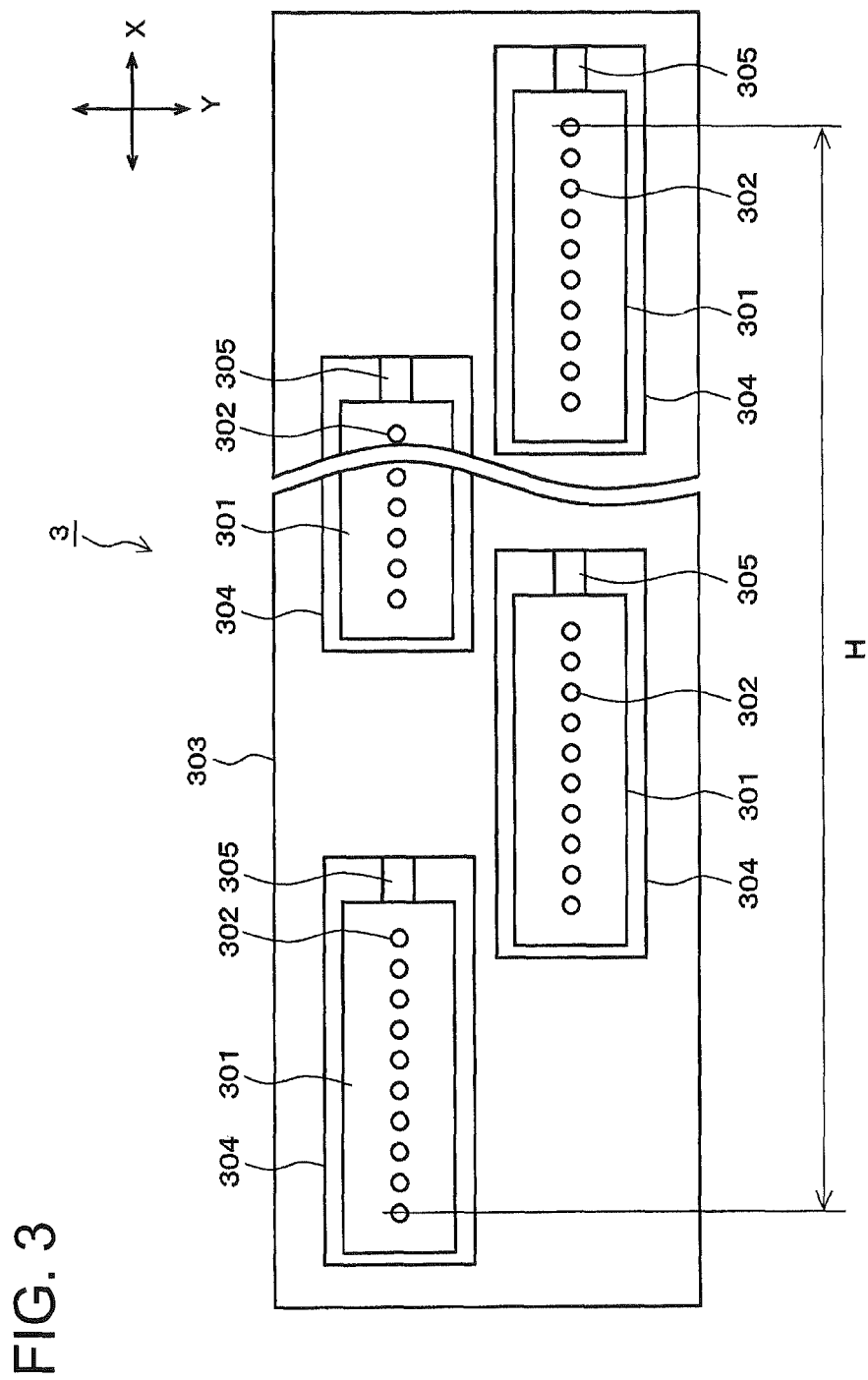
FIG. 3 is a diagram wherein a head module is viewed from a nozzle surface side.

FIG. 3 is a diagram wherein a head module is viewed from a nozzle surface side. This head module 3 is composed of a plurality of heads 301 each being capable of ink ejection processing by an inkjet mode, and the plural heads are arranged so that a nozzle surface of head 301 may face downward and can confront with an upper surface of substrate support stage 4 which is arranged below the lower surface of the nozzle surface.

Each head 301 has thereon many nozzles 302 arranged in the sub-scanning direction, and each of them is mounted on fitting frame section 304 that is formed to be open on head fixing tool 303, and long type head module 3 is constituted by arranging in a zigzag fashion so that pitches of nozzles 302 between adjoining heads 301 and 301 may be of the same pitch. On each fitting frame section 304, there is provided head position fine adjustment mechanism 305 between the head 301, and when the head position fine adjustment mechanism 305 is driven, it is possible to conduct fine adjustment for the position along the sub-scanning direction of each head 301 for the head fixing tool 303, and to adjust a relative position between heads 301. The head position fine adjustment mechanism 305 can be constituted with a piezoelectric element that conducts mechanical expansion and contraction movement when it is impressed by voltage, for example, and with a screw mechanism that is rotated by motor driving to conduct expansion and contraction movement.

The substrate support stage 4 is a flat rectangular surface plate provided on X movement mechanism 7 extended in the sub-scanning direction through θ rotation mechanism 5, and its upper surface is made to be horizontal placement surface 4a on which a substrate for image-drawing is placed by ink ejection processing, and an arrangement is made so that the horizontal placement surface 4a may be at a prescribed height for the nozzle surface of the head module 3. This substrate support stage 4 is arranged to be capable of moving linearly in the sub-scanning direction (second standard vector direction) by conducting sliding movement along the θ rotation mechanism 5 and X movement mechanism 7, and this X movement mechanism 7 is arranged to be capable of moving linearly in the θ rotation mechanism 5 and the main-scanning direction (first standard vector direction) by conducting sliding movement along the Y movement mechanism 6 that extends along the Y direction, and is further arranged to be capable of conducting rotation movement in the θ rotation by θ rotation mechanism 5 with an axis representing the direction along the Z direction.

Respective positions of the substrate support stage 4 in X direction, Y direction and θ rotation are detected at highly accurately by unillustrated encoders provided respectively on X movement mechanism 7, Y movement mechanism 6 and θ movement mechanism 5.

Each of the first camera 8 and the second camera 9 is a camera composed of CCD which functions as a camera for alignment for detecting alignment of the substrate in the present embodiment, and a lens surface is fixed to face downward fixedly with a prescribed interval decided in advance on gantry 15 provided to be in parallel with Y direction on device base stand 2. Positions of the lens surfaces of these first and second cameras 8 and 9 are arranged to be higher than the upper surface of the substrate placed on placing surface 4a (on substrate) of the substrate support stage 4, so that a prescribed range may be photographed by the first camera 8 and/or the second camera 9 that approaches when the substrate support stage 4 is moved to the gantry 15 side by X movement mechanism 7.

In general, there is a defect that a range of photographing by a camera becomes to be narrow because a range of movement in X, Y directions of the substrate support stage 4 is limited and a prescribed range on the substrate support stage 4 (on the substrate) cannot be fed in the field of view of the camera, thus, a broad range on the substrate support stage 4 cannot be covered by a single camera. However, in the present embodiment, this defect is corrected by increasing the number of cameras. Therefore, in the present invention, it is preferable that at least two cameras are provided in the Y direction at a prescribed interval, like these first and second cameras 8 and 9, with respect to alignment camera in the present invention. In this case, when the mutual positional relationship for plural cameras is not fixed, an accurate position of an image photographed by the camera cannot be detected, which is another problem. However, in the present invention, this problem is solved by defining mutual positional relationship of respective cameras. This point will be explained later.

Gantry 15 is positioned on the side of Y movement mechanism 6 that is opposite to maintenance area in device base stand 2, and on the outside of movable range W1 in X direction of head module 3. The movable range W1 in X direction of head module 3 is made to be this side of the first and second cameras fixed on the gantry 15, and even when head module 3 moves to the gantry 15 side, it does not interfere with the first and second cameras 8 and 9, and image-drawing operations are not affected.

Third camera 10 is a camera that is composed of CCD and functions as an impact confirming camera for confirming ink that is ejected from each nozzle 302 of head module 3 in the present embodiment and impacted on the substrate, and it is mounted fixedly at the prescribed position determined in advance on gantry 16 provided to be in parallel with X direction on device base stand 2, so that a lens surface may face downward. The height position of the lens surface of this third camera 10 is also arranged to be higher than the upper surface of the substrate placed on placing surface 4a of the substrate stage 4, so that a prescribed range on the placing surface 4a (on the substrate) can be photographed when the substrate support stage 4 is moved to the gantry 16 side by Y movement mechanism 6.

Gantry 16 is positioned to be in the vicinity of the end portion that is opposite to the end portion where the gantry 12 on which head module 3 is mounted on device base stand 2 is provided, and to be outside of movable range W2 in the Y direction of head module 3. The movable range W2 in Y direction of head module 3 is made to be this side of the third camera 10 fixed on the gantry 16, and even when head module 3 moves to the gantry 16 side, it does not interfere with the third camera 10, and image-drawing operations are not affected.

Figure 4:
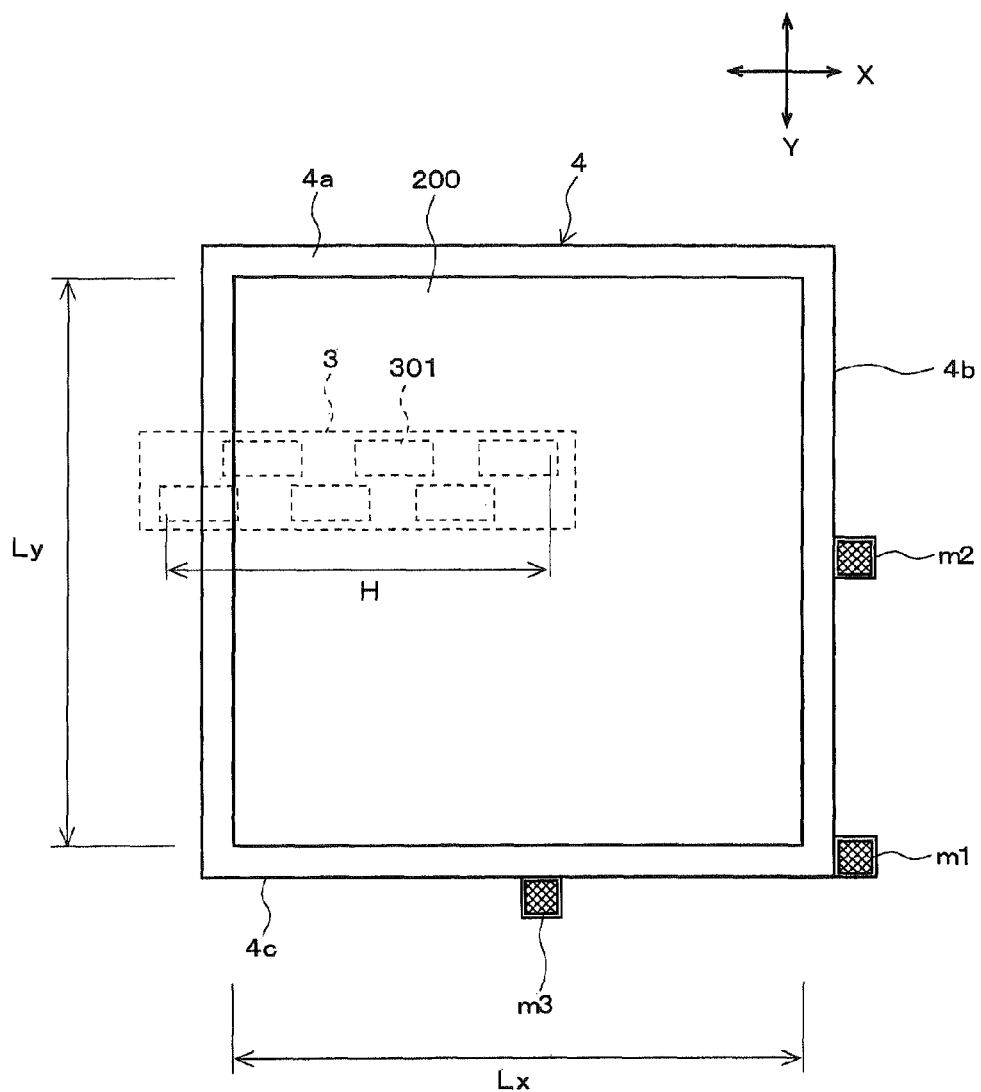
FIG. 4 is a plain view of a substrate support stage.

FIG. 4 is a plain view of substrate support stage 4. Head module 3 that is positioned to be higher than substrate support stage 4 is shown with dotted lines simultaneously.

The numeral 200 represents a substrate placed on placing surface 4a of substrate support stage 4, Lx represents a length of the substrate 200 in the X direction, Ly represents a length of the substrate 200 in the Y direction, and H represents a width between both ends of nozzle 302 of total heads 301 provided on the head module 3, namely a width (width of recording by head module 3) between two points of respective nozzles 302 on the end portion side of two heads 301 positioned between endmost sections in the sub-scanning direction inside the head module 3.

In the substrate support stage 4, on the side end section 4b on the side of gantry 15 on which the first and second cameras 8 and 9 are mounted, reference markers m1 and m2 are provided respectively on the corner section in the vicinity of side end section 4c of gantry 16 where the third camera 10 is attached and on the roughly central position in the Y direction, and reference marker m3 is also provided on side end section 4c on the gantry side 16.

These reference markers m1-m3 are those utilized to define a mutual positional relationship among the first, second and third cameras 8, 9 and 10, and each of them is formed to be a square in a planar view for easy image recognition.

Incidentally, in the present embodiment, reference marker m1 is provided for stipulating a position of the first camera 8, and in the first camera 8, it is possible to photograph, but in the second camera 9 and the third camera 10, they are positioned at a place where photographing is impossible. Further, in reference marker m2, it is not possible to photograph with the third camera 10, though it is possible to photograph with the first camera 8 and with the second camera 9. In addition, in reference marker m3, it is not possible to photograph with the second camera 9, though it is possible to photograph with the first camera 8 and with the third camera 10.

Now, relationship between visual fields of the first, second and third cameras 8, 9 and 10 and photographable ranges for substrate support stages 4 by the first, second and third cameras 8, 9 and 10 will be explained.

Figure 5A:
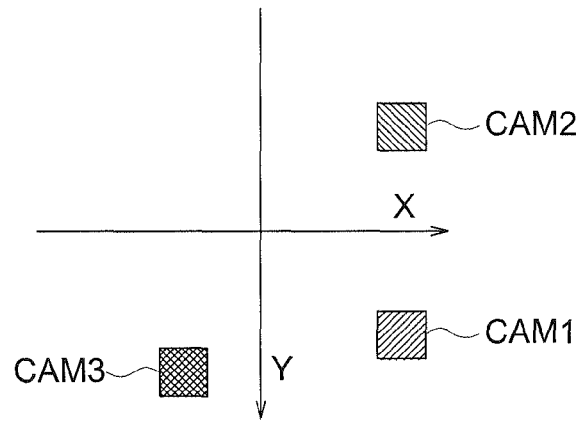
FIG. 5a is an explanatory diagram showing the relation between respective visual fields of the first, the second and the third cameras and the movable ranges of the substrate support stage.

FIG. 5 (A) is an explanatory diagram showing the relation between respective visual fields of the first, the second and the third cameras 8, 9 and 10 and the movable ranges of the substrate support stage 4. CAM1 shown with a small rectangular-shaped area is a visual field of the first camera 8, CAM2 is a visual field of the second camera 9, and CAM3 is a visual field of the third camera 10, and arrangement relationship of visual fields CAM1, CAM2 and CAM3 agrees with arrangement relationship of the first, second and third cameras 8, 9 and 10.

Further, lines shown with a cross show a movement course in the X and Y directions of the substrate support stage 4, and a length of the line shows a movable range.

Relationship between the substrate support stage 4 and photographable ranges of the first, the second and the third cameras 8, 9 and 10 will be explained by FIG. 5b, based on the aforesaid illustration.

In the drawings, large rectangular area A1 shown with one-dot chain line is a photographable range wherein substrate support stage 4 by the first camera 8 can be photographed by moving it into the visual field CAM1 of the camera 8, large rectangular area A2 shown with two-dot chain line is a photographable range wherein substrate support stage 4 by the second camera 9 can be photographed by moving it into the visual field CAM2 of the camera 9, and a large rectangular area A3 shown with broken line is a photographable range wherein substrate support stage 4 by the third camera 10 can be photographed by moving it into the visual field CAM3 of the camera 10.

Incidentally, in the actual inkjet image-drawing device 1, photographing is conducted by moving the substrate support stage 4 with respect to the first, second and third cameras 8, 9 and 10 which are in the fixed type. However, in FIG. 5b visual fields CAM 1, CAM 2 and CAM 3 respectively for the first camera, the second camera and the third camera which are viewed from the substrate support stage 4 and photographable ranges for respective cameras 8, 9 and 10 are shown for the convenience of explanations. Therefore, the FIG. 5b shows the state wherein the substrate support stage 4 is made to be in a fixed condition, and the first, second and third cameras 8, 9 and 10 have been moved relatively for the substrate support stage 4, while, keeping the positional relationship among the cameras 8, 9 and 10.

A photographable range on the substrate support stage 4 that can be photographed by only one camera such as the first camera, for example, is limited as explained above. However, it is understood that most range on the substrate support stage 4 can be made to be photographable if ranges for photographing by the second camera 9 and the third camera 10 are added. Accordingly, by defining the positional relationship among the first, the second and the third cameras 8, 9 and 10, these ranges can be regarded as a photographable range by a single camera, and it is possible to detect highly precisely the alignment of substrate 200 which will be described later and the coordinates of impact position in the case of confirmation.

Figure 6:
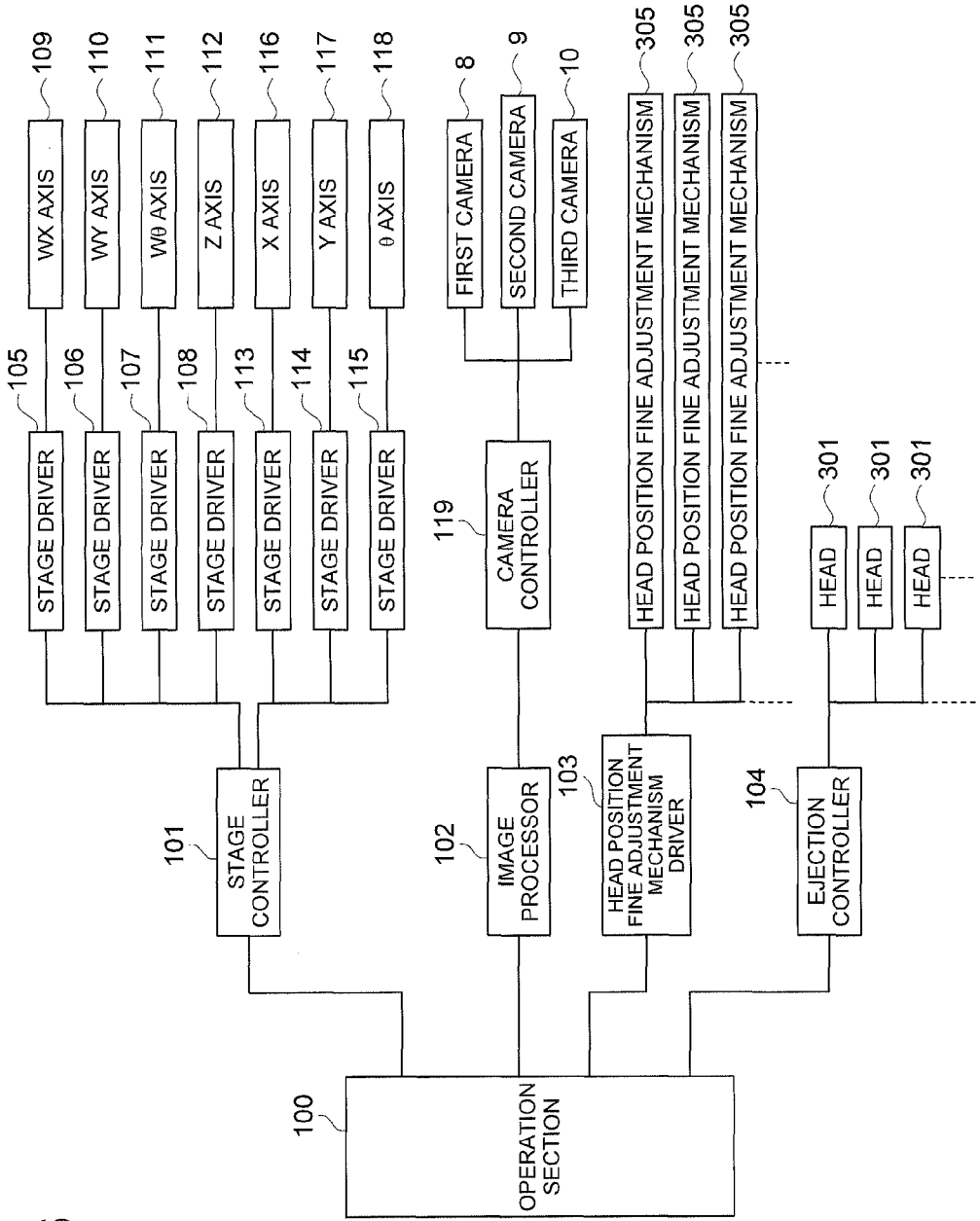
FIG. 6 is a block diagram showing a skeleton framework of the inside of an inkjet image-drawing device relating to the present invention.

FIG. 6 is a block diagram showing a skeleton framework of the inside of an inkjet image-drawing device relating to the present invention.

The numeral 100 represents an operation section that controls the whole, and it controls stage controller 101, image processor 102, head position fine adjustment mechanism driver 103 and ejection controller 104.

Stage controller 101 controls driving of stage drivers 105-108 based on control signals coming from operation section 100, and drives X axis motor 109 for moving slider 13 in the X direction, Y axis motor 110 for moving slider 13 in the Y direction, θ axis motor 111 for driving θ moving mechanism 14 that is for rotating head module 3 in the θ direction, and Z axis motor 112 for moving head module 3 upward and downward in the Z direction. Incidentally, a going up and down mechanism for head module 3 driven by Z axis motor 112 is utilized in the case of conducting maintenance for head module 3 in a maintenance area.

Further, the stage controller 101 controls driving of stage drivers 113-115 based on control signals coming from operation section 100, and it drives respectively X axis motor 116 for moving the substrate support stage 4 in the X direction, Y axis motor 117 for moving in the Y direction and drives θ axis motor 118 for rotating in the θ direction.

Image processor 102 controls driving of a cameral controller 119 based on control signals coming from operation section 100, and conducts imaging operations of the first, the second and the third cameras 8, 9 and 10 and conducts image processing for images which are imaged.

Head position fine adjustment mechanism driver 103 controls driving of head position fine adjustment mechanism 305 provided on each head 301 of head module 3, based on control signals coming from operation section 100, to conduct fine adjustment for mounting position of each head 301.

The ejection controller 104 controls driving of each head 301 of head module 3, based on control signals coming from operation section 100, and conducts ink ejection processing based on prescribed image-drawing data coming from each nozzle.

Figure 7:
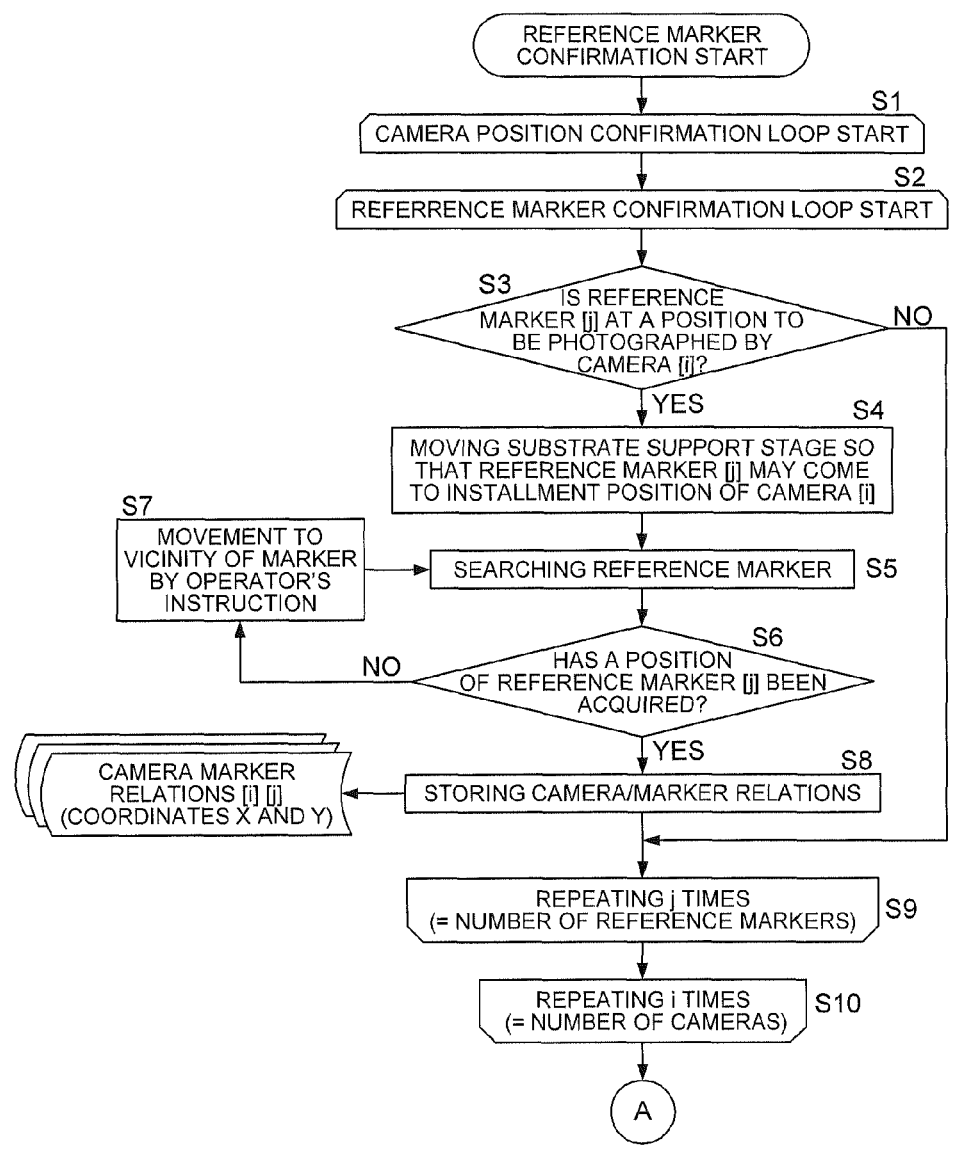
FIG. 7 is a flow chart showing a processing flow for defining a mutual positional relation among the first, the second and the third cameras.
Figure 8:
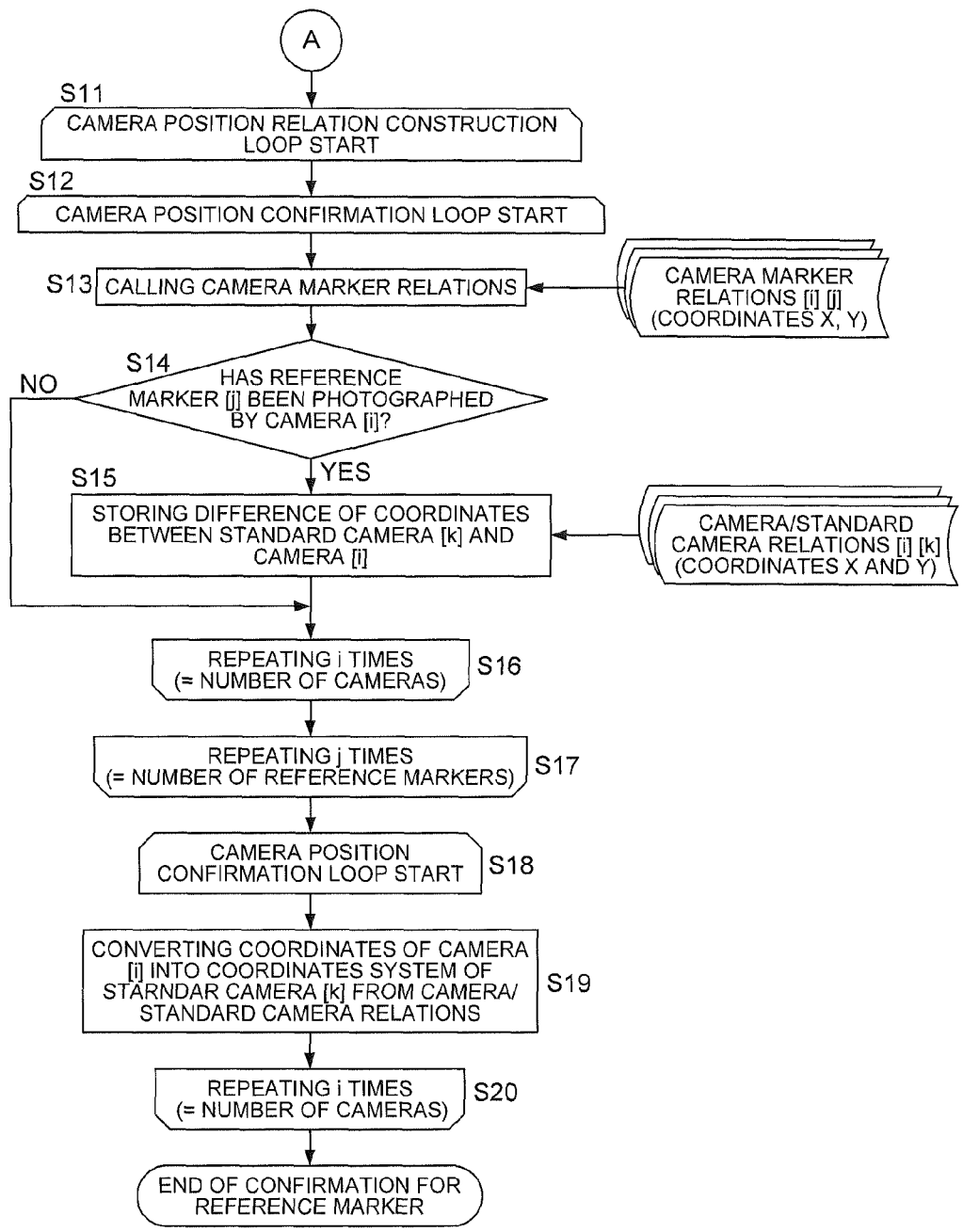
FIG. 8 is a flow chart showing a processing flow for defining a mutual positional relation among the first, the second and the third cameras.

Next, the processing flow for defining mutual positional relationship for the first, the second and the third cameras 8, 9 and 10 which are provided fixedly on device base stand 2 in the inkjet image-drawing device of this kind, will be explained based on FIGS. 7 and 8. This processing flow is practiced by the control of the operation section 100 in accordance with a prescribed program stored in a prescribed storing area in the operation section 100 in FIG. 6, for example, or in an unillustrated storing means in advance.

First, the camera position confirmation loop is started (S1), and then, the reference marker confirmation loop is started (S2) in this operation.

In the reference marker confirmation loop, any one of plural reference markers m1-m3 (which is reference marker m1, in this case) is confirmed whether it is in the photographable position or not (S3) with a camera arranged at a photographable position (which is the first camera 8, in this case), and when it is photographable (in the case of Yes), the substrate support stage 4 is moved (S4) so that the reference marker m1 may come to the vicinity of the installation position of the first camera 8. Since the position of the first camera 8 and the position of the reference marker m1 are decided in advance, it is possible to know whether the reference marker m1 has come to the vicinity of the visual field CAM 1 of the first camera 8 or not, by detecting a movement of the substrate support stage 4 with an encoder.

After the movement of the substrate support stage 4, a search (image recognition) of the reference marker m1 is started (S5) based on an image taken by the first camera 8, to judge (S6) whether the position of the reference marker m1 has been obtained or not. When the position is not obtained (in the case of No), the substrate support stage 4 is moved under the instruction of an operator, so that the reference marker m1 may come to the inside of visual field CAM 1 of the first camera 8 (S7).

In this case, image recognition operations for obtaining the position of the reference marker m1 are conducted by moving the substrate support stage 4 so that the reference marker m1 may come to the prescribed position decided in advance in the visual field CAM 1 of the first camera 8.

FIGS. 9a-c shows the situation of the foregoing. With respect to this prescribed position, it is preferable, from the viewpoint of easy acquisition of the position by image recognition that the prescribed position is made to be the center (on an optical axis of the first camera 8) in the visual field CAM 1 of the first camera 8. Whether the reference marker m1 has come to the center in the visual field CAM 1 of the first camera 8 or not can be judged by image recognition for the image taken by the first camera 8.

Therefore, in the processing of the aforesaid steps S4-S7, the substrate support stage 4 is moved so that the reference marker m1 may be positioned at the center of visual field CAM 1 of the first camera 8 as mentioned above, to acquire the position of the reference marker m1 by conducting image recognition for the image thus taken (FIG. 9a).

When the position of the reference marker m1 is acquired through image recognition (in the case of Yes), the relationship between the first camera 8 in that case and the reference marker m1 (camera/marker relationship) is stored (S8). The relationship between the first camera 8 and the reference marker m1 represents positional coordinates of the substrate support stage 4 in X and Y directions (X1$m$1 and Y1$m$1) detected by the encoder in the case of photographing of reference marker m1 by the first camera 8. The positional coordinates are stored in the operation section 100 or in an unillustrated storage means, as positional coordinates in the case of position acquisition of the reference marker m1 by the first camera 8.

The confirmation processing for the reference marker is conducted for all reference markers which are photographable. In the first camera 8, confirmation treatments for reference markers by the first camera 8 are conducted for all reference markers m1-m3 in the same way because all of the reference markers m1-m3 can be photographed by the first camera 8, and the confirmation treatments are repeated for the number of times equivalent to the number of the reference markers (three times, in this case). Namely, storing of positional coordinates for the reference marker m2 and storing of positional coordinates for the reference marker m3 are conducted one after another in the same way sequentially (S9).

FIG. 9b shows how reference marker m2 is confirmed by the first camera 8 and how the position is acquired, and thereby, the positional coordinates in the X and Y directions of the substrate support stage 4 (X 1$m$2 and Y 1$m$2) are acquired and are stored. Further, FIG. 9c shows how reference marker m3 is confirmed by the first camera 8 and how its position is acquired, and thereby, the positional coordinates in the X and Y directions of the substrate support stage 4 (X 1$m$3 and Y 1$m$3) are acquired and are stored.

Confirmation processing for the reference marker is conducted for all cameras. Therefore, after the positional coordinates for all reference markers m1-m3 are stored by the first camera 8, positional coordinates of reference markers which can be photographed by the second camera 9 and the third camera 10 are stored also by the second camera 9 and the third camera 10 (S10).

FIGS. 10a-10c shows how reference markers are confirmed and how positional coordinates are acquired by the second camera 9.

Figure 5B:
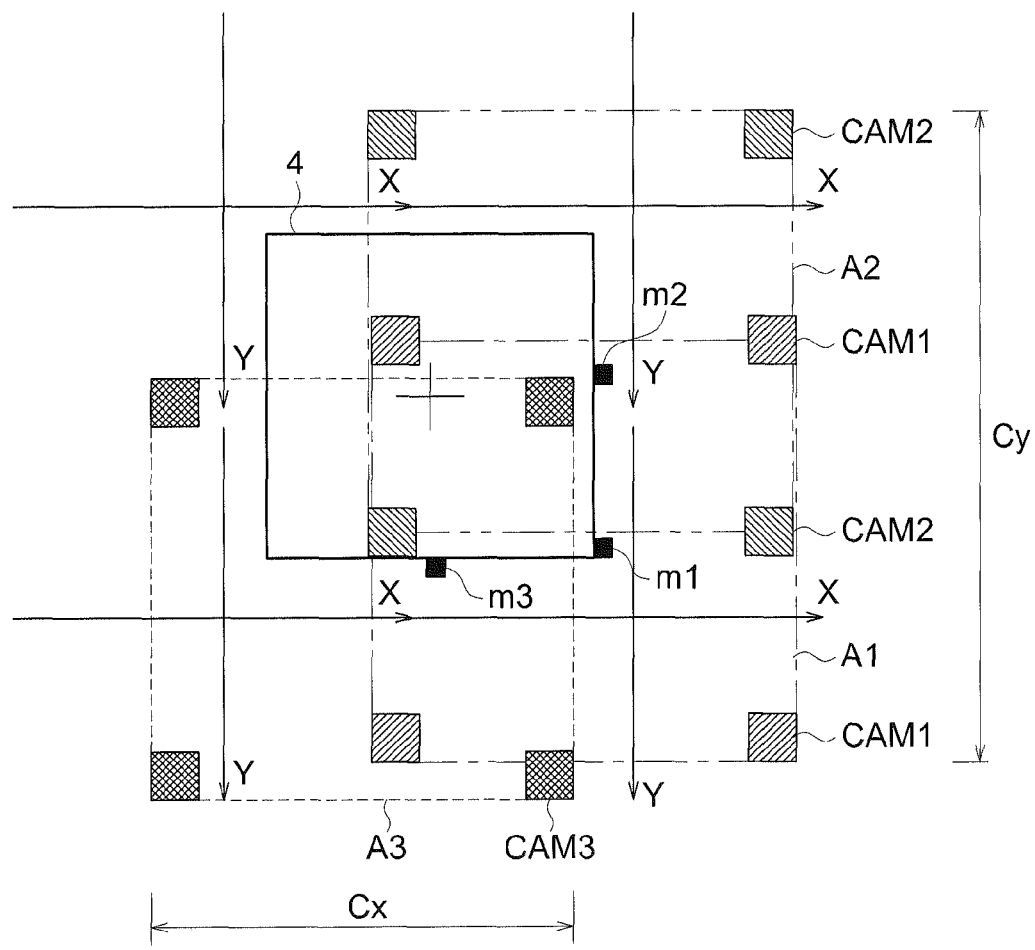
FIG. 5b is an explanatory diagram showing the relation between the substrate support stage and the photographable range of the first, the second and the third cameras.

As is shown in FIG. 5b, reference markers m1 and m3 become to be outside of a movable range of the substrate support stage 4 because they are outside of photographable range A2 by the second camera 9, and it is impossible to acquire their positions by the second camera 9 (FIGS. 10a and 10c).

However, since the reference marker m2 is within photographable range A2 by the second camera 9, a position of the reference marker m2 can be acquired by the second camera 9, and its positional coordinates (X 2$m$2 and Y 2$m$2) are acquired and are stored (FIG. 10 (B)).

FIGS. 11a-11c shows how a reference marker is confirmed by the third camera 10 and how the positional coordinates are acquired.

As is shown in FIG. 5b, reference markers m1 and m2 become to be outside of a movable range of the substrate support stage 4 because they are outside of photographable range A3 by the third camera 10, and it is impossible to acquire their positions by the third camera 10 (FIGS. 11a and 11b).

However, since the reference marker m3 is within photographable range A3 by the third camera 10, a position of the reference marker m3 can be acquired by the third camera 10, and its positional coordinates (X 3$m$3 and Y 3$m$3) are acquired and are stored in the same way as in the foregoing (FIG. 11$c$).

Owing to the aforesaid processing, positional relationship between the first, second and third cameras 8, 9 and 10 and reference markers m1-m3 which are photographable by the aforesaid cameras is acquired, and then, a camera position relationship construction loop is started based on the aforesaid relationship (S11) and a camera position confirmation loop is started in this construction loop (S12). As stated above, the first camera 8 and the second camera 9 are both photographable in the reference marker m2, thus, the first camera 8 is associated with the second camera 9. Further, the first camera 8 and the third camera 10 are both photographable in the reference marker m3, thus, the first camera 8 is associated with the third camera 10. As a result, the second camera 9 and the third camera 10 can be associated with each other by the first camera 8, which means that all cameras 8, 9 and 10 are associated with each other.

In the camera position confirmation loop, positional coordinates of the camera/marker relationship stored in the aforesaid step S8 is called (S13), and it is judged whether the reference marker m1 was photographed by the first camera 8 first or not (whether the positional coordinates are stored or not) (S14).

When the reference marker m1 has been photographed (in the case of Yes), a difference of coordinates from a standard camera is stored (S15) successively. The standard camera in this case means a camera that is a standard in the case of defining mutual positional relationship for the first, second and third cameras 8, 9 and 10, and it is either one of the first, second and third cameras 8, 9 and 10. In the present embodiment, the first camera 8 is made to be the standard camera, although there is no restriction, in particular. Therefore, a difference of coordinates between the first camera 8 in the aforesaid step S15 and the standard camera becomes to be zero to be stored in operation section 100 or in an unillustrated storage means.

As is mentioned above, camera position confirmation treatments in steps S12-S15 are carried out for all cameras. Therefore, storing of a difference of coordinates from the standard camera conducted by the second camera 9 and storing of a difference of coordinates from the standard camera conducted by the third camera 10 are conducted in succession in the same way continuously (S16).

Incidentally, since the reference marker m1 is photographed only by the first camera 8, a difference of coordinates between the second camera 9 and the standard camera and a difference of the coordinates between the third camera 10 and a standard camera, are conducted by the positional coordinates acquired by the reference markers m2 and m3.

Namely, a difference of coordinates between the second camera 9 and the standard camera (the first camera 8) (ΔX2, ΔY2) becomes to be (ΔX2, ΔY2)=(X2$m$2−X1$m$2, Y2$m$2−Y1$m$2) by the positional coordinates acquired by reference marker m2, and a difference of coordinates between the third camera 10 and the standard camera (the first camera 8) (ΔX3, ΔY3) becomes to be (ΔX3, ΔY3)=(X3$m$3−X1$m$3, Y3$m$3−Y1$m$3) by the positional coordinates acquired by reference marker m3, to be stored respectively (S17). Owing to this, camera/standard-camera relationship is constructed.

After the camera/standard-camera relationship is constructed in the aforesaid way, processing to convert coordinates of respective cameras into the coordinates system of the standard camera is started (S18-S20).

In this case, since the first camera 8 is made to be a standard camera, reference marker m1 is photographed for the first camera 8 for prescribing the standard position to acquire position coordinates (X1$m$1, Y1$m$1) in the case of photographing of the reference marker m1, then, the coordinates of the second camera 9 are acquired by (X1$m$1+ΔX2, Y1$m$1+ΔY2) and coordinates of the third camera 10 are acquired by (X1$m$1+ΔX3, Y1$m$1+ΔY3).

Owing to this, the positional coordinates of the second and third cameras 9 and 10 whose standard is the first camera 8 are decided, thus, the positional relationship for the first, second and third cameras 8, 9 and 10 are defined. Therefore, even when plural cameras arranged fixedly on device base stand 2 are used, a position of the image taken by the second camera 9, for example, can be detected by the coordinates in the first camera 8 which is a standard camera, because mutual positional relationship for camera is clear, thereby, detection of alignment of substrate 200 and confirmation of impact position can be carried out accurately.

Defining of mutual positional relationship for plural cameras may either be conducted in advance in the manufacturing process (such as at factory shipment) of inkjet image-drawing device 1, or be conducted automatically at prescribed interval determined in advance by the control of operation section 100, after inkjet image-drawing device 1 is installed for actual operations. Or, the defining is also possible to be conducted at suitable timing by the instruction form the outside such as an operator.

Next, a processing flow for installing substrate 200 on substrate support stage 4 in such inkjet image-drawing device will be explained based on a flow chart shown in FIG. 12. This processing flow is practiced by the control of operation section 100, following the prescribed program stored in advance in the prescribed storage area in the operation section 100 in FIG. 6, for example, or in an unillustrated storage means.

First, after the substrate 200 is placed on placement surface 4$a$ (S100), a substrate marker confirmation loop is started (S101).

Now, a plain view of the substrate 200 is shown in FIG. 13. On two adjoining corner sections on the surface (image-drawing surface) of the rectangular-shaped substrate 200, there are formed small alignment markers 201 and 202. Each of them is cross-shaped in this case, but a shape is disregarded. The substrate 200 is placed on placement surface 4$a$ of substrate support stage 4 by an operator or by a suitable conveyance means so that a vector direction of a straight line connecting two alignment markers 201 and 202 may roughly be in parallel with Y direction representing a main scanning direction, and so that side edge 200$a$ on which the alignment markers 201 and 202 are formed may be arranged on the gantry 15 side on which the first and the second cameras 8 and 9 are provided.

After the substrate 200 is placed, it is judged whether image recognition can be conducted by the first and second cameras 8 and 9 or not for the substrate 200, and when the image has been recognized (in the case of Yes), the substrate support stage 4 is moved (S103) so that a position of one of the alignment markers 201 and 202 (in this case, alignment marker 201 is to be searched) may come to the vicinity of the first camera 8 or the second camera 9, and alignment marker 201 is searched (S104) by the first camera 8 or the second camera 9.

On the other hand, when it is impossible to confirm in the aforesaid step S102 (in the case of No), the substrate support stage 4 is moved (S105) so that a position of the alignment marker 201 may come to the vicinity of either one of cameras provided on gantry 16 that is in parallel with the sub-scanning direction, namely, to the vicinity of the third camera 10 in the case of the present embodiment, and the alignment marker 201 is searched by the third camera 10 (S106).

As a result, if image recognition can be conducted for alignment marker 201 on substrate 200 by any one of cameras 8, 9 and 10, its marker position is acquired as a coordinates system by the first camera 8 that is a standard camera (S107).

When it is not possible to acquire (in the case of No), the substrate support stage 4 is moved by instructions of an operator to conduct image recognition by any one of cameras 8, 9 and 10 for coordinates of the alignment marker 201 on the substrate 200, and the coordinates are acquired as a coordinates system by the first camera 8 that is a standard camera (S108).

For example, when coordinates conversion is conducted from coordinates $P_{CAM2}(X2_p, Y2_p)$ of alignment marker 201 taken by the second camera 9 into coordinates $P_{CAM1}(X1_p, Y1_p)$ of the standard camera, the coordinates of alignment marker 201 become P $(X2p, Y2p)=(X1p-\Delta X2, Y1p-\Delta Y2)$.

Positional coordinates of the alignment marker 201 acquired in the aforesaid way are stored in operation section 100 or in an unillustrated storing means (S109).

The aforesaid treatments in steps S102-S109 are conducted in the same way also for another marker 202 (S110).

When the substrate 200 is assumed to be placed at an appropriate position on the substrate support stage 4 in this case, coordinates in the X direction for alignment markers 201 and 202 become to be the same, and alignment marker 201 and alignment marker 202 are thought to move on the same track (the direction vector in the main scanning direction), when the substrate support stage 4 is moved straightly in the Y direction. This is an ideal value for a movement of the substrate 200, and let it be called an estimated position of a marker after correction. The positional coordinates of this estimated position of a marker after correction are stored in the operation section 100 or in an unillustrated storing means in advance.

Next, positional coordinates of respective alignment markers 201 and 202 stored in the aforesaid step S109 are compared with positional coordinates of estimated position of marker after correction, which are stored in advance, to measure a residual (staggered angle) in the sub-scanning direction. When a distance between the alignment markers 201 and 202 is short, there is a fear that an error is caused on a measurement position, and a calculation error for a trigonometric function in the case of calculating a rotation angle in the θ direction of the substrate support stage 4 grows greater. However, in the invention, it is possible to make a distance between alignment markers 201 and 202 to be long because image recognition for alignment markers 201 and 202 can be conducted by using plural cameras (the first and the second cameras 8 and 9) in the main scanning direction, which controls occurrence of errors extremely.

Values of the residuals obtained through measurement in this way are stored in operation section 100 or in an unillustrated storing means (S111).

Next, based on the value of the residual obtained, an amount of θ rotation of the substrate support stage 4 that makes the residual in the main scanning direction to be smallest and an amount of XY movement are calculated. The amount of θ rotation and the amount of XY movement thus calculated are stored temporarily in the operation section 100 or in an unillustrated storing means (S112), and continuously, stage drivers 113-115 are driven based on the amount of θ rotation and the amount of XY movement thus stored, and positions of the substrate support stage 4 in θ direction and XY direction are corrected (S113). Owing to this, when the substrate support stage 4 is moved in the main scanning direction, respective markers 201 and 202 become to be capable of moving on the same track in the main scanning direction, with respect to the substrate 200 placed on placement surface 4a of the substrate support stage 4.

After this, processing of ink ejection from head module 3 is conducted based on prescribed image-drawing data, and a prescribed pattern is drawn on the substrate 200 while the substrate support stage 4 is moved in XY directions (S114). Since the position of the substrate support stage 4 is corrected so that respective alignment markers 201 and 202 of the substrate 200 may agree with the direction vector in the main scanning direction, stability for straight image-drawing in the main scanning direction is excellent, which makes it possible to conduct highly accurate image-drawing.

Incidentally, in cases where Cy represents a length of the composite imaging range along the main scanning direction (see FIG. 5b), Lx represents a length of substitute 200 along the sub-scanning direction (see FIG. 4), I represents guarantee accuracy of measurement for reference marks m1-m3 and M represents tolerance accuracy for targeted position shifting, the targeted positioning tolerance accuracy can be maintained with respect to composite imaging range (A1+A2) of the photographable range A1 and A2 of the first and the second cameras 8 and 9 provided on gantry 15 that is in parallel with the main scanning direction, if the first and the second cameras 8 and 9 are installed so that a range of at least Cy>2I (1/tan(2 arcsin (M/2Lx))) may become to be photographable.

Namely, as shown in FIG. 14, when a position (a measurement point) is shifted by a guarantee accuracy (measurement error) by I for the actual alignment markers 201 and 202 on the substrate 200, if the aforesaid position is estimated to be shifted by 2I, as the worst case, angle θ of a right triangle formed by point a1—point a3 is expressed by tan θ=2I/Cy. On the other hand, position shifting on the end edge in the sub-scanning direction of substrate P in the case of shifting I is an isosceles triangle formed by point a3—point a5 whose vertex is a3. Therefore, tolerance accuracy M is expressed by M=2Lx×sin(θ/2). Therefore, Cy can be expressed by Cy=2I/tan(2 arcsin (M/2Lx)).

In this case, Lx is in an order of scores hundreds, and M is in an order of μm or in an order of several nm, in general. Therefore, it is preferable to establish the first camera 8 and the second camera 9 so that a range broader than Cy>2I. Lx/M may become photographable, by approximating the aforesaid calculation. However, in the aforesaid expression, M≥I holds constantly, and Cy>Ly>Lx is always satisfied.

Incidentally, guarantee accuracy I is an accuracy decided by errors in the case of measurement of optical system of the first and the second cameras 8 and 9 and it includes optical errors, errors in the case of image processing and errors of processing for alignment markers 201 and 202. Further, tolerance accuracy M is an allowable targeted value of position shilling, and it can be decided properly. And, Ly represents a length of the substrate 200 that is in parallel with the main scanning direction (see FIG. 4).

By establishing the first camera 8 and the second camera 9 so that a range broader than this range may become photographable, it is possible to put an accuracy for positioning of substrate 200 in targeted accuracy M when θ correction of substrate support stage 4 is conducted even when positions of alignment markers 201 and 202 provided on substrate 200 are changed. By establishing the first camera 8 and the second camera 9 in this way, it becomes possible to calculate an amount of θ rotation by θ rotation mechanism 5 of the substrate support stage 4 for correcting as a standard for positioning of substrate 200, under the condition that coordinates in the main scanning direction for two alignment markers 201 and 202 agree each other, thus, linear image-drawing stability becomes to be excellent. Therefore, even in the case where the substrate support stage 4, for example, does not meet at right angles with XY directions, the stability of image-drawing in the main scanning direction can be secured, and skew distortion can be corrected easily because the sub-scanning direction can be corrected easily by adjustment of projection timing.

Owing to this, even when a length between alignment markers is made to be long, the alignment markers can be photographed, direct advance stability is increased and accuracy of image-drawing can be improved.

Next, a processing flow in the case of correcting an impact position of ink dripped from head module 3 in the inkjet image-thawing device 1 of this kind will be explained based on a flow chart shown in FIG. 15. This processing flow is practiced by control of operation section 100, in accordance with a prescribed program that is stored in a prescribed storing area in operation section 100 in FIG. 6, for example, or in an unillustrated storing means.

As a substrate to be used for correction of a position of impact, a test substrate for confirming an impact position, and after the test substrate is placed on placement surface 4*a* of the substrate support stage 4 (S200), and after image-drawing for a test image on the test substrate by ejecting ink from each nozzle of all heads 301 of head module 3 (S201), head position confirmation loop is started (S202), in which nozzle position confirmation loop is started (S203).

First, the substrate support stage 4 is moved (S204) so that an impact position (position of expected impact) on the test substrate may become to be close to any camera fixed on gantry 16 provided in the sub-scanning direction (X direction), namely, the third camera 10 in the present embodiment, concerning impact by ink droplet ejected from each nozzle of any one head 301, and the impact on the test substrate support is searched by the third camera 10 (S205).

With respect to impact, its existence or nonexistence can be confirmed by confirming an impact pattern that represents a prescribed nozzle arrangement pattern, by conducting image recognition for an image taken by the third camera 10. Therefore, an impact position is acquired (S206) by confirmation of existence or nonexistence of impact, and when it is not possible to acquire (in the case of No), the substrate support stage 4 is moved in XY directions visually by instructions of an operator, and impact is searched in the same way as in the foregoing (S207).

When the impact position has been acquired (in the case of Yes), the coordinates of its impact position are stored in operation section 100 with coordinates of the first camera 8 that is the standard camera desired already, or in an unillustrated storing means (S208). Coordinates of this impact position are those of the center of gravity of each dot of the impact dropped from each nozzle of head 301 that is an impact position to be confirmed.

The aforesaid processing treatments for steps S203-S208 are repeated for the number of times equivalent to the number of nozzles of the head 301, and in the same way, coordinates of impact position are obtained for each nozzle (S209).

Further, confirmation of impact position is conducted repeatedly for all heads 301 of head module 3. Therefore, processing treatments for the aforesaid steps 203-209 are conducted repeatedly for all heads 301 of head module 3 (S210).

After finishing confirmation of impact positions for all heads 301 of head module 3 as stated above, total inclination, namely, inclination of head module 3 (inclination on Z axis) is estimated based on the coordinates of impact position stored on the aforesaid step 208, and an amount of θ rotation of head module 3 in the case of requiring correction is calculated. A value of the amount of θ rotation thus calculated is stored in operation section 100 or in an unillustrated storing means (S211).

Next, based on coordinates of impact position stored in the aforesaid step 208, a position of each head 301 of head module 3, namely, existence or nonexistence of mutual shifting of each head 301 is estimated, and ejection timing and/or an amount of adjustment of head position fine adjustment mechanism 305 for adjusting a position of fixing of each head 301 are calculated. A value of the calculated amount of adjustment is stored in operation section 100 or in an unillustrated storing means (S212).

After that, based on an amount of θ rotation stored in the aforesaid step 211, stage driver 107 is driven to operate θ rotation mechanism 14, and position adjustment in θ direction of head module 3 is carried out (S213), and further, an impact position is corrected by adjusting ejection controller 104 and/or head position fine adjustment mechanism 305, based on ejection timing and/or head fine adjustment amount stored in the aforesaid step S212, (S214).

In this case, in photographable range A3 of the third camera 10 provided on gantry 16 that is in parallel with sub-scanning direction, when Cx represents a length of a photographable range along the sub-scanning direction (see FIG. 5*b*), and H represents a width of both ends of nozzle 302 of all heads 301 installed on head module 3, namely, a width of two points of respective nozzles 302 and 302 on the end section side of two heads 301 and 301 positioned on the endmost sections in the sub-scanning direction in the head module 3 (see FIG. 4), it is preferable that the third camera 10 is installed so that a condition of Cx>H is satisfied.

When controlling coordinates of impact, a test substrate is established, and image-drawing for impact confirmation is conducted so that images may be in the position where the image can be confirmed by the third camera 10 installed on gantry 16 that is in parallel with sub-scanning direction, namely, in the position of photographable range A3, to confirm a position of impact. When the third camera 10 is provided in the way to satisfy the condition of Cx>H, it is possible to confirm impacts from all heads 301 of head module 3 by the third camera 10, and positional relationship between impact positions and positions of coordinates system of the substrate support stage 4 is cleared.

Further, this confirmation of impact positions makes the positional relationship between respective heads 301 which are equipped on head module 3 to be clear, thus, when a position of either one head 301 in the sub-scanning direction is shifted as a result of the confirmation of impact position, for example, it is possible to adjust the position by giving instructions to head position fine adjustment mechanism 305 from operation section 100, to make the position of the head 301 along the sub-scanning direction to be an appropriate position.

By controlling ejection controller 104 in accordance with results of the confirmation of impact positions, in operation section 100, it is possible to correct a starting position in the case of ink ejection processing and thereby to adjust so that impact at an appropriate position may be achieved.

In inkjet image-drawing device 1 relating to the present invention, θ correction of substrate 200 and coordinates control for impact are made possible by the aforesaid processing, and a result of this measurement makes impact and offset shifting of substrate 200 to be possible to be measured, resulting in an occasion wherein positioning of impact for the substrate 200 can be carried out highly accurately without interfering with head module 3.

Incidentally, in the aforesaid explanation, two sets of cameras including the first camera 8 and the second camera 9 are installed on gantry 15 that is in parallel with the main scanning direction, as cameras for alignment. The number of these cameras may either be three or more and or be one only.

Further, on gantry 16 that is in parallel with the sub-scanning direction, only one camera of the third camera 10 is provided as a camera for impact position confirmation, in the aforesaid explanation. However, it is also possible to provide a plurality of cameras at prescribed intervals in the sub-scanning direction, also on the gantry 16.

Explanations of Symbols
- 1 Inkjet image-drawing device
- 2 Base stand
- 3 Head module
  - 301 Head
  - 302 Nozzle
  - 303 Head fixer
  - 304 Fixing frame
  - 305 Head position fine adjustment mechanism
- 4 Substrate support stage
  - 4a Placing surface
  - 4b, 4c Side end sections
  - m1-m3 Reference markers
- 5 θ rotation mechanism
- 6 Y movement mechanism
- 7 X movement mechanism
- 8 First camera
  - CAM1 Visual field of first camera
- 9 Second camera
  - CAM2 Visual field of second camera
- 10 Third camera
  - CAM3 Visual field of third camera
- 11 Maintenance area
- 12 Gantry
- 13 Slider
- 14 θ rotation mechanism
- 15 Gantry
- 16 Gantry
- 200 Substrate
- 201, 202 Alignment markers

What is claimed is:

1. An inkjet image-drawing device comprising:
a head module which comprises one or a plurality of inkjet heads for forming a pattern by executing ink ejection processing on a substrate;
a head module moving means which moves the head module in at least one of a main scanning direction and a sub-scanning direction;
a substrate support stage which supports the substrate to be placed lower than the head module;
a substrate support stage moving means which comprises:
a first linear moving means which linearly moves the substrate support stage in a first standard vector direction;
a second linear moving means which linearly moves the substrate support stage in a second standard vector direction independent from the first standard vector direction; and
a rotation moving means which rotationally moves the substrate support stage with an axis of a vector direction parallel with a normal direction to the first and second standard vector directions;
an image pickup means which picks up an image on a surface of the substrate placed on the substrate support stage; and
an alignment adjusting means which picks up images of a plurality of alignment markers arranged on the substrate with the image pickup means, and moves the substrate support stage with the substrate support stage moving means based on a result of the picking up images to adjust the alignment of the substrate,
wherein the image pickup means comprises at least a single camera fixedly disposed, outside of a reachable moving range of the head module moved by the head module moving means, in the vector direction of the first linear moving means, on the main body of the inkjet image-drawing device, and at least a single camera fixedly disposed outside of a reachable moving range of the head module moved by the head module moving means, in the vector direction of the second linear moving means, on the main body of the inkjet image-drawing device;
wherein the substrate support stage comprises a plurality of markers for measuring a standard camera position, and two cameras of the image pickup means is arranged to be capable of commonly photographing of at least one marker of the plurality of reference markers;
wherein the inkjet image-drawing device further comprises a calculation means which associates with coordinates between the two cameras of the image pickup means, based on positional coordinates of a result of photographing of the reference markers by the image pickup means; and
wherein the calculation means calculates images picked up by the image pickup means, and by assuming any one of the two cameras to be a standard camera, converts coordinates of another camera to a coordinates system of the standard camera.

2. The inkjet image-drawing device of claim 1, further comprising:
an impact position confirmation means which picks up an image of the substrate with the image pickup means, and confirms an impact position of an ink droplet ejected onto the substrate from the head module, based on a result of the picking up image.

3. The inkjet image-drawing device of claim 2, wherein at least the single camera fixedly disposed, outside of the reachable moving range of the head module moved by the head module moving means, in the vector direction of the first linear moving means, on the main body of the inkjet image-drawing device is an impact position confirming camera for confirming the impact position of the ink droplet ejected onto the substrate, and
at least the single camera fixedly disposed, outside of the reachable moving range of the head module moved by the head module moving means, in the vector direction of the second linear moving means, on the main body of the inkjet image-drawing device is an alignment camera for adjusting the alignment of the substrate.

4. An inkjet image-drawing device comprising:
a head module which comprises one or a plurality of inkjet heads for forming a pattern by executing ink ejection processing on a substrate;
a head module moving means which moves the head module in at least one of a main scanning direction and a sub-scanning direction;

a substrate support stage which supports the substrate to be placed lower than the head module;
a substrate support stage moving means which comprises:
  a first linear moving means which linearly moves the substrate support stage in a first standard vector direction;
  a second linear moving means which linearly moves the substrate support stage in a second standard vector direction independent from the first standard vector direction; and
  a rotation moving means which rotationally moves the substrate support stage with an axis of a vector direction parallel with a normal direction to the first and second standard vector directions;
an image pickup means which picks up an image on a surface of the substrate placed on the substrate support stage;
an alignment adjusting means which picks up images of a plurality of alignment markers arranged on the substrate with the image pickup means, and moves the substrate support stage with the substrate support stage moving means based on a result of the picking up images to adjust the alignment of the substrate, and
an impact position confirmation means which picks up an image of the substrate with the image pickup means, and confirms an impact position of an ink droplet ejected onto the substrate from the head module, based on a result of the picking up image;
wherein the image pickup means comprises at least a first single camera fixedly disposed, outside of a reachable moving range of the head module moved by the head module moving means, in the vector direction of the first linear moving means, on the main body of the inkjet image-drawing device, and at least a second single camera fixedly disposed outside of a reachable moving range of the head module moved by the head module moving means, in the vector direction of the second linear moving means, on the main body of the inkjet image-drawing device; and
wherein the first single camera is an impact position confirming camera for confirming the impact position of the ink droplet ejected onto the substrate, and the second single camera is an alignment camera for adjusting the alignment of the substrate, and
wherein a photographable range of the alignment camera is established to satisfy $Cy > 2I \, Lx/M$, where $Cy$ represents a length of the photographable range in a main scanning direction, $Lx$ represents a length of the substrate in a sub-scanning direction, $Ly$ represents a length of the substrate in the main scanning direction, $I$ represents a guaranteed accuracy for measurement of the alignment markers, and $M$ represents tolerance accuracy for a target position shift, and wherein relationships $M > I$ and $Cy > Ly > Lx$ hold constantly.

5. An inkjet image-drawing device comprising:
a head module which comprises one or a plurality of inkjet heads for forming a pattern by executing ink ejection processing on a substrate;
a head module moving means which moves the head module in at least one of a main scanning direction and a sub-scanning direction;
a substrate support stage which supports the substrate to be placed lower than the head module;
a substrate support stage moving means which comprises:
  a first linear moving means which linearly moves the substrate support stage in a first standard vector direction;
  a second linear moving means which linearly moves the substrate support stage in a second standard vector direction independent from the first standard vector direction; and
  a rotation moving means which rotationally moves the substrate support stage with an axis of a vector direction parallel with a normal direction to the first and second standard vector directions;
an image pickup means which picks up an image on a surface of the substrate placed on the substrate support stage;
an alignment adjusting means which picks up images of a plurality of alignment markers arranged on the substrate with the image pickup means, and moves the substrate support stage with the substrate support stage moving means based on a result of the picking up images to adjust the alignment of the substrate, and
an impact position confirmation means which picks up an image of the substrate with the image pickup means, and confirms an impact position of an ink droplet ejected onto the substrate from the head module, based on a result of the picking up image;
wherein the image pickup means comprises at least a first single camera fixedly disposed, outside of a reachable moving range of the head module moved by the head module moving means, in the vector direction of the first linear moving means, on the main body of the inkjet image-drawing device, and at least a second single camera fixedly disposed outside of a reachable moving range of the head module moved by the head module moving means, in the vector direction of the second linear moving means, on the main body of the inkjet image-drawing device; and
wherein the first single camera is an impact position confirming camera for confirming the impact position of the ink droplet ejected onto the substrate, and the second single camera is an alignment camera for adjusting the alignment of the substrate, and
wherein a photographable range of the impact position confirming camera is established to satisfy $Cx > H$, where $Cx$ represents a length of the photographable range in a sub-scanning direction, and $H$ represents a width between two points of both ends of the head module in the sub-scanning direction.

* * * * *